US012163911B2

(12) United States Patent
Pan et al.

(10) Patent No.: US 12,163,911 B2
(45) Date of Patent: Dec. 10, 2024

(54) CAPACITIVE SENSOR HOUSING FOR CHAMBER CONDITION MONITORING

(71) Applicant: Applied Materials, Inc., Santa Clara, CA (US)

(72) Inventors: Yaoling Pan, Santa Clara, CA (US); Patrick John Tae, Palo Alto, CA (US); Leonard Tedeschi, San Jose, CA (US); Michael D. Willwerth, Campbell, CA (US); Daniel Thomas McCormick, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 158 days.

(21) Appl. No.: 17/861,034

(22) Filed: Jul. 8, 2022

(65) Prior Publication Data

US 2022/0341867 A1 Oct. 27, 2022

Related U.S. Application Data

(62) Division of application No. 16/812,071, filed on Mar. 6, 2020, now Pat. No. 11,415,538.

(51) Int. Cl.
*G01N 27/22* (2006.01)
(52) U.S. Cl.
CPC ......... *G01N 27/226* (2013.01); *G01N 27/228* (2013.01)
(58) Field of Classification Search
USPC .................................. 324/660–663
See application file for complete search history.

(56) References Cited

U.S. PATENT DOCUMENTS

| 4,432,238 A | 2/1984 | Tward |
| 5,846,883 A * | 12/1998 | Moslehi ............... H01J 37/321 438/711 |
| 8,226,769 B2 | 7/2012 | Matyushkin et al. |
| 8,287,650 B2 | 10/2012 | Lee et al. |
| (Continued) | | |

FOREIGN PATENT DOCUMENTS

| CN | 1956505 A | 5/2007 |
| JP | 2005064359 A | 3/2005 |
| (Continued) | | |

OTHER PUBLICATIONS

International Search Report and Written Opinion from PCT Patent Application No. PCT/US2021/014197 dated May 6, 2021, 11 pgs.

(Continued)

*Primary Examiner* — Vincent Q Nguyen
(74) *Attorney, Agent, or Firm* — Schwabe, Williamson & Wyatt, P.C.

(57) ABSTRACT

Embodiments disclosed herein include a sensor assembly. In an embodiment, the sensor assembly comprises a sensor module and a housing assembly. In an embodiment, the sensor module comprises a substrate, a capacitor with a first electrode and a second electrode on the substrate, and a capacitive-to-digital converter (CDC) electrically coupled to the first electrode and the second electrode. In an embodiment, the housing assembly is attached to the sensor module and comprises a shaft, wherein the shaft is hollow, and a cap over a first end of the shaft, wherein the cap has an opening to expose the capacitor.

14 Claims, 15 Drawing Sheets

(56) References Cited

U.S. PATENT DOCUMENTS

| | | | |
|---|---|---|---|
| 8,633,423 B2 | 1/2014 | Lin et al. | |
| 2009/0151871 A1 | 6/2009 | Pease et al. | |
| 2011/0268595 A1 | 11/2011 | Yamamuro et al. | |
| 2013/0087286 A1 | 4/2013 | Carducci et al. | |
| 2014/0127976 A1* | 5/2014 | Duescher | B24B 37/042 |
| | | | 451/41 |
| 2016/0069716 A1 | 3/2016 | Beavis et al. | |
| 2016/0370173 A1* | 12/2016 | Paul | H01J 37/32935 |
| 2018/0350564 A1* | 12/2018 | Vane | H01J 37/32596 |
| 2020/0072651 A1 | 3/2020 | Tadas et al. | |

FOREIGN PATENT DOCUMENTS

| | | |
|---|---|---|
| JP | 2018-124179 | 8/2018 |
| JP | 2019522900 A | 8/2019 |
| JP | 7283148 B2 | 5/2023 |
| KR | 101672255 B1 | 11/2016 |
| KR | 1020180002840 A | 1/2018 |
| KR | 1020190042831 A | 4/2019 |
| KR | 1020190126726 A | 11/2019 |
| TW | 201506701 A | 2/2015 |
| TW | 201738573 A | 11/2017 |
| WO | WO 98-05974 | 2/1998 |
| WO | WO 2012-166313 | 12/2012 |
| WO | 2019/036139 A1 | 2/2019 |

OTHER PUBLICATIONS

Non-Final Office Action from U.S. Appl. No. 16/812,071 dated Jan. 7, 2022, 11 pgs.

Preliminary Report on Patentability from Patent Application No. PCT/US2021/014197 dated Sep. 15, 2022, 7 pgs.

Official Letter from Taiwan Patent Application No. 110102436 dated Feb. 21, 2023, 11 pgs.

Preliminary Rejection from Korean Patent Application No. 10-2022-7032848 dated Jun. 19, 2024, 9 pgs.

Official Letter from Taiwan Patent Application No. 113101686 dated Jun. 20, 2024, 9 pgs.

* cited by examiner

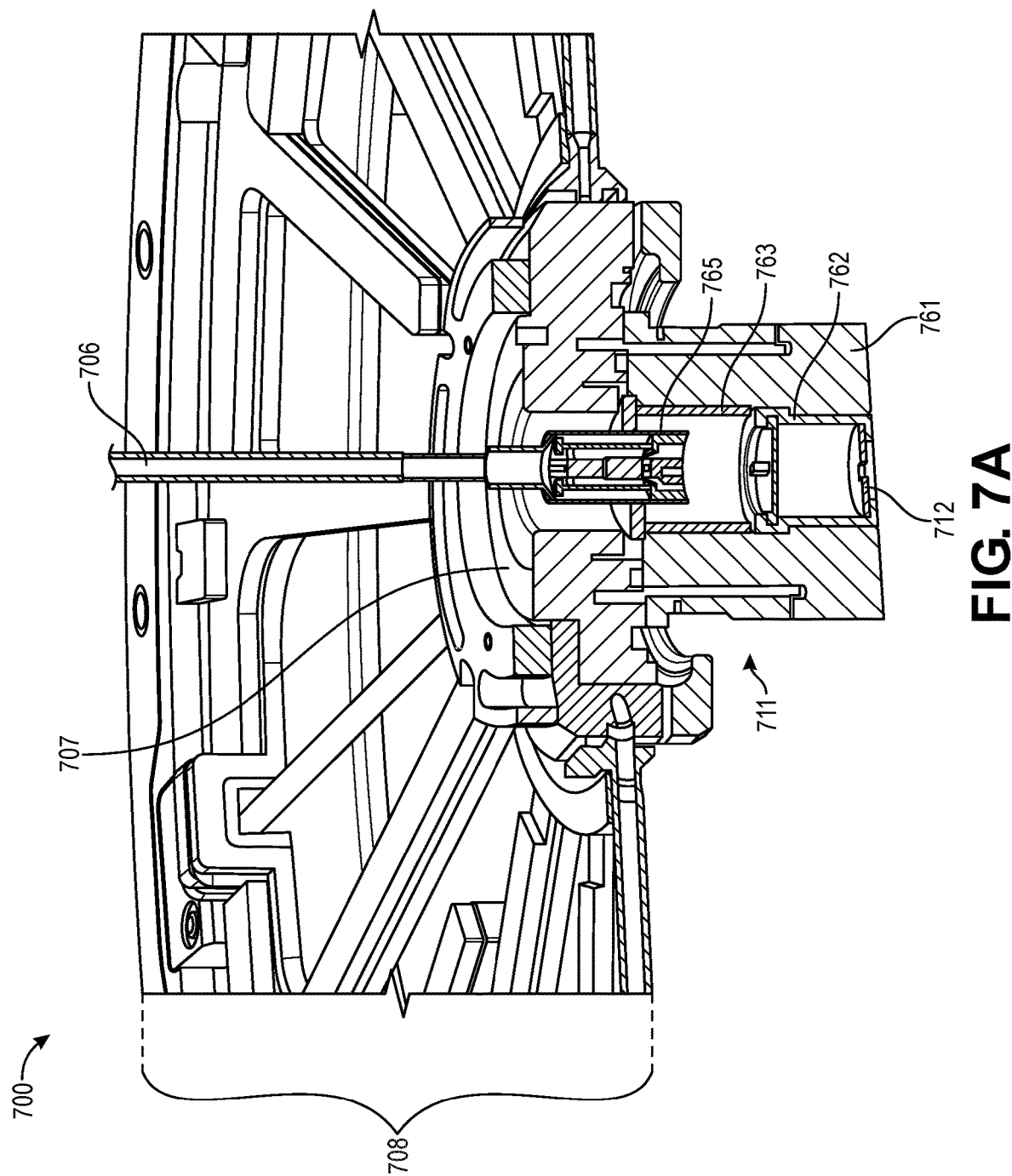

CAPACITIVE SENSOR HOUSING FOR CHAMBER CONDITION MONITORING

CROSS-REFERENCE TO RELATED APPLICATIONS

This application is a Divisional of U.S. patent application Ser. No. 16/812,071, filed on Mar. 6, 2020, the entire contents of which are hereby incorporated by reference herein.

BACKGROUND

1) Field

Embodiments relate to the field of semiconductor manufacturing and, in particular, to capacitive sensors for monitoring chamber conditions.

2) Description of Related Art

The fabrication of microelectronic devices, display devices, micro-electromechanical systems (MEMS), and the like require the use of one or more processing chambers. For example, processing chambers such as, but not limited to, a plasma etch chamber, a plasma enhanced chemical vapor deposition chamber, a physical vapor deposition chamber, a plasma treatment chamber, or an ion implantation chamber may be used to fabricate various devices. As scaling continues to drive to smaller critical dimensions in such devices, the need for uniform and stable processing conditions (e.g., uniformity across a single substrate, uniformity between different lots of substrates, and uniformity between chambers in a facility) is becoming more critical in high volume manufacturing (HVM) environments.

Processing non-uniformity or instability arises from many different sources. One such source is the condition of the process itself. That is, as substrates are processed in a chamber, the chamber environment may change. For example, in an etching process, etch byproducts may be deposited on the interior surfaces of a chamber as a result of a redeposition process. The buildup of a redeposition layer on the interior surfaces of the chamber can alter the plasma chemistry in subsequent iterations of a process recipe and result in process drift.

To combat process drift, the processing chamber may be cleaned periodically. An in-situ chamber clean (ICC) may be implemented to reset the chamber condition. Currently, ICCs are primarily recipe based. That is, a set recipe is executed in order to clean the processing chamber. Some ICCs may use an optical emission spectrometry (OES) system for end-point determination of the process recipe. However, there is no way to directly measure the condition (e.g., the thickness of the redeposition layer, thickness of a seasoning layer, etc.) of interior surfaces of the processing chamber.

The processing chamber may also be opened in order to manually clean portions of the processing chamber or to replace worn consumables within the processing chamber. However, opening a processing chamber results in significant down time since the processing chamber needs to be pumped back down to the desired vacuum pressure, seasoned, and the chamber needs to be revalidated before production substrates can be processed. Opening of the processing chamber may occur at predetermined intervals (e.g., after a certain number of substrates have been processed) or after an excursion is detected. Relying on predetermined intervals may result in opening the chamber too often. As such, the throughput is decreased. In the case of excursion detection, correction of the chamber condition is made after damage to production substrates has already occurred. As such, yield is decreased.

SUMMARY

Embodiments disclosed herein comprise various sensor assemblies for use in different locations of a processing tool. In an embodiment, a sensor assembly comprises a sensor module and a housing assembly. In an embodiment, the sensor module comprises a substrate, a capacitor with a first electrode and a second electrode on the substrate, and a capacitive-to-digital converter (CDC) electrically coupled to the first electrode and the second electrode. In an embodiment, the housing assembly is attached to the sensor module and comprises a shaft, wherein the shaft is hollow, and a cap over a first end of the shaft, wherein the cap has an opening to expose the capacitor.

In an embodiment, an additional sensor assembly comprises a shaft with a first end and a second end, wherein the shaft is hollow. The sensor assembly may further comprise a capacitor on a first surface of a substrate, wherein a second surface of the substrate interfaces with the first end of the shaft, and a cap over the first end of the shaft, wherein the cap secures the substrate against the first end of the shaft, and wherein an opening through the cap exposes the capacitor.

An additional embodiment may comprise a sensor assembly that comprises a vacuum electrical feedthrough, wherein the vacuum electrical feedthrough comprises a first flange where the first flange has a first hole, and a housing body attached to the vacuum electrical feedthrough, wherein the housing body has an internal volume, a first end, and a second end, and wherein the housing body comprises a second flange on the first end of the housing body, where the second flange has a second hole that is aligned with the first hole on the vacuum electrical feedthrough. In an embodiment, the sensor assembly further comprises a shaft having a first end and a second end, wherein the first end of the shaft is attached to the second end of the housing body, wherein the shaft is hollow, and a capacitive sensor secured against the second end of the shaft by a cap, wherein the cap comprises an opening to expose a first electrode and a second electrode of the capacitive sensor.

BRIEF DESCRIPTION OF THE DRAWINGS

FIG. 7A is a partial perspective illustration of a portion of a processing tool that depicts a sensor housing assembly integrated with a chamber lid, in accordance with an embodiment.

DETAILED DESCRIPTION

Figure 1:
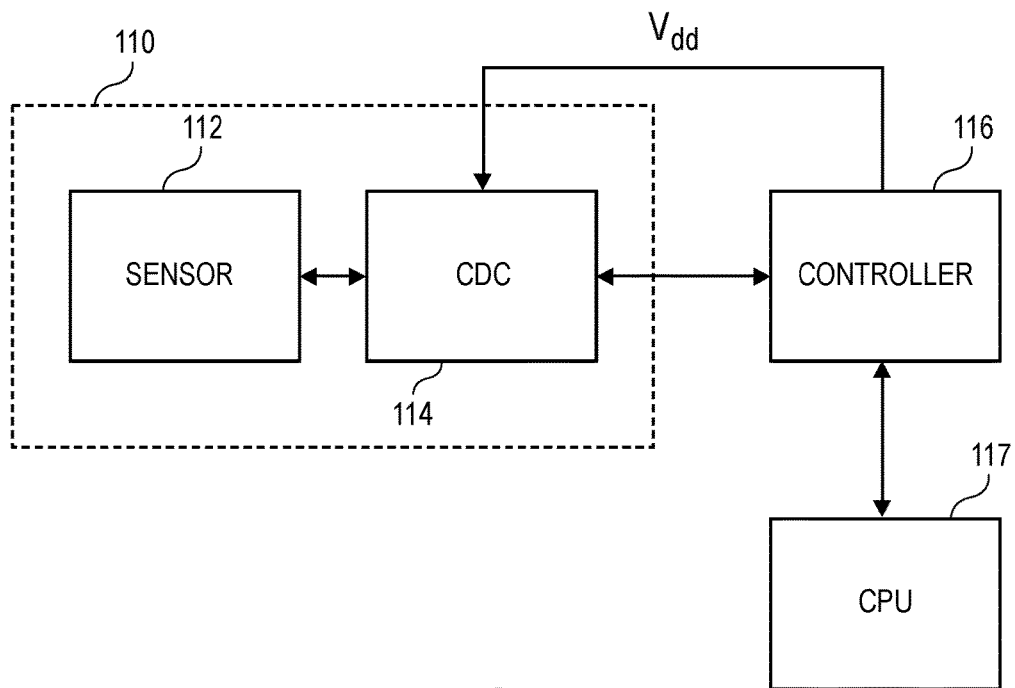
FIG. 1 is a schematic diagram of a sensor module and the communication network between the sensor module and a computing device, in accordance with an embodiment.

Systems and methods described herein include capacitive sensors for monitoring chamber conditions. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

As noted above, changes to the chamber condition may impact process uniformity and stability (e.g., uniformity across a single substrate, uniformity between different lots of substrates, and uniformity between chambers in a facility). Accordingly, it is desirable to monitor the chamber conditions within a processing tool in order to improve process uniformity. Embodiments disclosed herein include capacitive sensor assemblies that may be integrated into the processing tool in order to monitor one or more chamber conditions.

One chamber condition that may be monitored is the deposition of materials (e.g., redeposition of etch byproducts) onto the interior surfaces of the chamber. Such redeposition layers may result in changes to the plasma chemistry and, therefore, may result in process non-uniformities or instabilities. Additionally, a seasoning layer may be disposed over interior surfaces of the chamber for some processes. Changes to the seasoning layer may also result in process non-uniformities. As such, it is desirable to monitor changes to the seasoning layer. An additional chamber condition that may be monitored in order to limit process non-uniformities or instabilities is the temperature of various components within the chamber (e.g., chamber wall temperature, showerhead temperature, etc.). Additionally, one or more components within a chamber may be considered consumable components. That is, during the operation of the chamber, various components may be worn and eventually need to be replaced. For example, a process ring may be one such consumable component. As such, it is also desirable to monitor the degree of erosion of such consumable components in order to determine when replacement is necessary in order to maintain high process uniformity.

The use of capacitive sensor assemblies in accordance with embodiments disclosed herein allow for monitoring of such chamber conditions. The capacitive sensor assemblies disclosed herein allow for high precision measurement of the various chamber conditions. Changes in the capacitance of the capacitive sensor module of the assembly is detected when material (e.g., etch byproducts) is deposited over electrodes of the capacitive sensor. Alternatively, removal of material (e.g., during an ICC process) may be measured by changes in capacitance.

The capacitive sensor assemblies disclosed herein may be positioned in one or more different locations of the processing tool in order to provide chamber condition measurements for various components. For example, a sensor assembly may be positioned along a chamber wall, in an evacuation region, integrated with a lid assembly, and/or proximate to a process ring around the substrate. Embodiments disclosed herein include sensor assemblies that are able to withstand the environmental conditions within a processing chamber. For example, the sensor assembly may be protected by a barrier layer that is substantially etch resistant. Furthermore, the barrier layer may also be fluorination resistant in order to improve signal integrity. That is, without fluorination resistance, fluorine that diffuses into the barrier layer will cause changes in the capacitance of the sensor module. The sensor assembly may also be compatible with elevated processing temperatures (e.g., approximately 400° C. or greater). Additionally, the sensor assembly is formed with materials that limit cross contamination and/or particle generation.

Furthermore, the capacitive sensor assemblies allow for real time monitoring of the chamber conditions. This is because electrical feeds through chamber walls, such as vacuum electrical feedthroughs, allow for output from the sensor modules to be monitored during processing in the chamber. Real time monitoring allows for feedforward adjustments to be made to processing recipes in order to account for existing process non-uniformities.

In an embodiment, a capacitive sensor assembly (also referred to as a sensor assembly for brevity) may include a sensor module and a sensor housing assembly. The sensor module may include a capacitor (e.g., a first electrode and a second electrode) that is disposed over a substrate. The sensor module may also include a capacitance-to-digital converter (CDC) for converting the capacitance output from the capacitor into a digital signal for subsequent data processing.

In order to integrate the sensor module with the processing tool, a sensor housing assembly may be used to house the sensor module. The sensor housing assembly comprises features to secure the sensor module within the processing chamber while allowing the capacitor of the sensor module to be exposed to the processing environment. The sensor housing assembly may also include components for interfacing with ports through a chamber wall or chamber lid of the processing tool in order to allow for data to be captured in real time.

In a particular embodiment, the sensor housing assembly comprises a hollow shaft and a cap. The sensor module may be secured against an end of the shaft by the cap. A hole through the cap exposes the capacitor of the sensor module. The hollow shaft allows for interconnects (e.g., wires, pins, etc.) from the sensor module to be protected from the processing environment and fed to a vacuum electrical feedthrough in order to exit the chamber without disrupting the chamber vacuum.

Different locations for the sensor module may result in modifications to the various components of the sensor housing assembly and modify how the components interface with the chamber itself. For example, in the case of a chamber wall sensor, the shaft may extend through a port in the chamber wall and the vacuum electrical feedthrough may be external to the chamber. In the case of a lid sensor, the shaft may extend out from the lid into the chamber and the vacuum electrical feedthrough may be embedded in the lid. In the case of a process ring sensor, the shaft may extend up from a bottom chamber surface and intersect a plasma screen that is adjacent to the process ring. In such embodiments, the vacuum electrical feedthrough may be positioned within a port through the bottom chamber surface. In the case of an evacuation region sensor, the shaft may be inserted through a port through a chamber wall, and the vacuum electrical feedthrough may be outside the chamber wall. In some embodiments, an adapter may be fitted around portions of the sensor housing assembly in order to provide a hermetic seal along ports with any dimension.

In some embodiments, portions of the sensor assembly may be considered a consumable component. For example, the sensor module may be replaced after a certain period of time or after significant sensor drift is detected. The sensor housing assembly may be easily disassembled to allow for simple replacement. In a particular embodiment, the shaft may have a threaded end that screws into a main housing that is attached to the vacuum electrical feedthrough. As such, the shaft and other components attached to the shaft (e.g., the cap and the sensor module) may be removed and replaced by screwing a new shaft to the main housing. In other embodiments, the entire sensor assembly may be considered a consumable component, and the entire sensor assembly may be replaced after a certain period of time or after significant sensor drift is detected.

Referring now to FIG. 1, a schematic illustration of a sensor module 110 is shown, in accordance with an embodiment. In an embodiment, the sensor module 110 comprises a sensor 112 and a CDC 114. The sensor 112 is a capacitive sensor. That is, the output from the sensor 112 is a capacitance. The capacitance output may then be converted to a digital signal by the CDC for further processing. The CDC may be implemented on an ASIC die. In an embodiment, the sensor module 110 is controlled by a controller 116. The controller 116 may also provide power (i.e., $V_{dd}$) to the sensor module 110. The controller 116 may be communicatively coupled to a computing device 117 or integrated into the computing device 117. The computing device 117 may control the operation of a processing tool that is being monitored by the sensor module 110. As such, a capacitance output from the sensor 112 may be used to alter process recipes, cleaning schedules, or the like to account for chamber condition non-uniformities.

Figure 2:
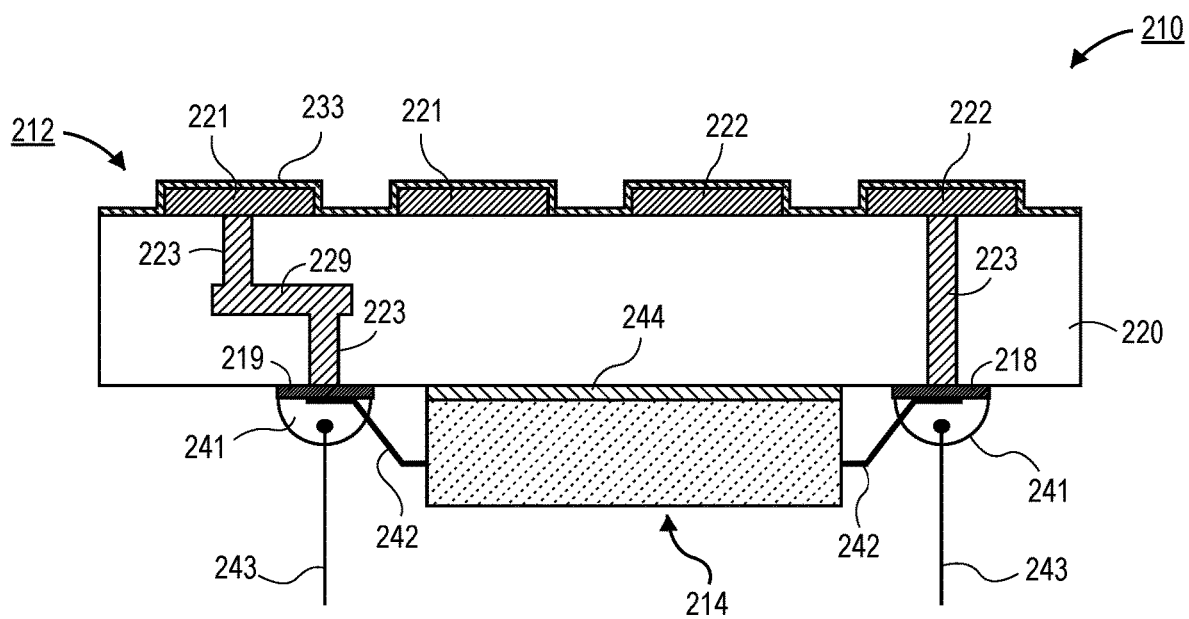
FIG. 2 is a cross-sectional illustration of a sensor module that may be integrated in a sensor housing assembly to monitor a chamber condition, in accordance with an embodiment.

Referring now to FIG. 2, a cross-sectional illustration of a sensor module 210 is shown, in accordance with an embodiment. In an embodiment, the sensor module 210 comprises a sensor 212 and a CDC 214. In an embodiment, the sensor 212 may comprise a substrate 220, a first electrode 221 over the substrate 220, and a second electrode 222 over the substrate 220. The substrate 220 may comprise materials, such as, but not limited to, silicon, silicon oxide, aluminum oxide, aluminum nitride, plastics, or other insulating materials. In order to allow for manufacture of a high volume of the sensors, the substrate 220 may be a material that is compatible with high volume manufacturing (HVM) processes. That is, the substrate 220 may be a material that is available in panel form, wafer form, or the like.

In FIG. 2, there appears to be two distinct first electrodes 221 and two distinct second electrodes 222. However, it is to be appreciated that the first electrodes 221 may be connected together out of the plane of FIG. 2, and the second electrodes 222 may be connected together out of the plane of FIG. 2. In an embodiment, the first electrode 221 and the second electrode 222 may be conductive materials that are compatible with microelectronic processing operations. For example, the material for the first electrode 221 and the second electrode 222 may comprise, but is not limited to, aluminum, molybdenum, tungsten, titanium, nickel, chromium, and alloys thereof.

The first electrode 221 may be electrically coupled to a first pad 219 on the opposite surface of the substrate 220 by a conductive path (e.g., including traces 229 and vias 223). The second electrode 222 may be electrically coupled to a second pad 218 on the opposite surface of the substrate 220 by a conductive path (e.g., including a via 223). In an embodiment, the conductive paths (e.g., traces 229 and vias 223) embedded in the substrate 220 may comprise conductive materials, such as, but not limited to, tungsten, molybdenum, titanium, tantalum, alloys thereof, and the like. In an embodiment, the first pad 219 and the second pad 218 may comprise materials, such as, but not limited to titanium, nickel, palladium, copper, and the like. In some embodiments, the first pad 219 and the second pad 218 may be multi-layer stacks to improve integration with the CDC 214. For example, the first pad 219 and the second pad 218 may comprise stacks such as titanium/nickel/palladium, titanium/copper/palladium, or other material stacks commonly used for interconnect pads.

In an embodiment, a layer 233 may be disposed over surfaces of the first electrode 221, the second electrode 222, and the substrate 220. In a particular embodiment, the layer 233 may be a conformal layer. That is, a thickness of the layer 233 over top surfaces of the first electrode 221 and the second electrode 222 may be substantially similar to a thickness of the layer over sidewall surfaces of the first electrode 221 and the second electrode 222. Layer 233 may be a barrier layer that protects the sensor 212 during processing within a chamber. In the particular embodiment of a plasma chamber used for etching, the layer 233 may comprise one or more of a metallic oxide, a metallic fluoride, and a metallic oxyfluoride. The layer 233 may comprise materials, such as, but not limited to, aluminum oxide, magnesium oxide, yttrium oxyfluoride, yttrium zirconium oxyfluoride, yttrium aluminum oxide, or hafnium oxide. While examples of material suitable for the layer 233 in an etching plasma chamber are provided, it is to be appreciated that materials used for the layer 233 may be optimized for various processing environments. For example, a plasma treatment chamber, a plasma assisted deposition chamber, or the like have different processing environments that may require different materials in order to minimize various design concerns, such as, but not limited to, damage to the sensor, cross-contamination, diffusion of various species, and the like.

In an embodiment, the CDC 214 is attached to the backside surface of the substrate 220 (i.e., opposite from the electrodes 221, 222) by an adhesive 244 or the like. The CDC 214 is electrically coupled to the first pad 219 and the second pad 218 by interconnects 242. For example, the interconnects 242 may be wire bonds or the like. In an embodiment, the interconnects 242 are coupled to the first pad 219 and the second pad 218 by a solder 241. The use of a solder 241 to attach the interconnects 242 to the pads 218, 219 may be practical when the sensor module 210 is utilized in low temperature environments (e.g., less than approximately 200° C.). In some embodiments, the CDC 214 may be secured to the substrate 220 only by the solder 241. That is, the adhesive 244 may be omitted. In other embodiments (described in greater detail below) the solder 241 is omitted in order to allow for use of the sensor module 210 in high temperature environments (e.g., approximately 400° C. or greater). The CDC 214 may be implemented as an ASIC die. In some embodiments, a PN junction within the CDC 214 may be used by the sensor module 210 for temperature monitoring. In other embodiments, a temperature sensor (not shown) may be disposed on the substrate 220. For example, the temperature sensor may be a resistive temperature detector (RTD), a thermocouple (TC) sensor, or thermistor (TR) sensor.

Applying voltage to the first electrode 221 and the second electrode 222 generates charge across the capacitor between the first electrode 221 and the second electrode 222. The capacitance of the capacitor is dependent on different factors, such as, the geometry of the first electrode 221 and the second electrode 222, the spacing between the first electrode 221 and the second electrode 222, and the presence (or absence) of material over the first electrode 221 and the second electrode 222.

As material is added over the first electrode 221 and the second electrode 222 (e.g., a redeposition of etch byproducts during an etching process) or removed from over the first electrode 221 and the second electrode 222 (e.g., during an ICC process), the capacitance changes. The change in capacitance is an indication that there has been a change in the chamber condition. Depending on the design of the first electrode 221 and the second electrode 222, the resolution of the sensor 212 may be approximately 20 aF or smaller, and have an accuracy of approximately 5 fF or smaller. Accordingly, small changes in the chamber condition may be detected by sensors 212 such as those described herein.

As will be described in greater detail below, the sensor modules 210 may be integrated with a sensor housing assembly to form a sensor assembly. Integrating sensor assemblies, such as those described herein, with a processing apparatus allows for chamber conditions to be monitored during the execution of various processing recipes, during transitions between substrates, during cleaning operations (e.g., ICC operations), during chamber validation, or during any other desired time. Furthermore, the architecture of the sensor assemblies allows for securing the sensor modules in many different locations. Such flexibility allows for many different components of a processing apparatus to be monitored simultaneously in order to provide enhanced abilities to determine the cause of chamber drift. For example, FIG. 3 provides a schematic of a processing apparatus 300 that includes the integration of capacitive sensor assemblies 311 in various locations.

Figure 3:
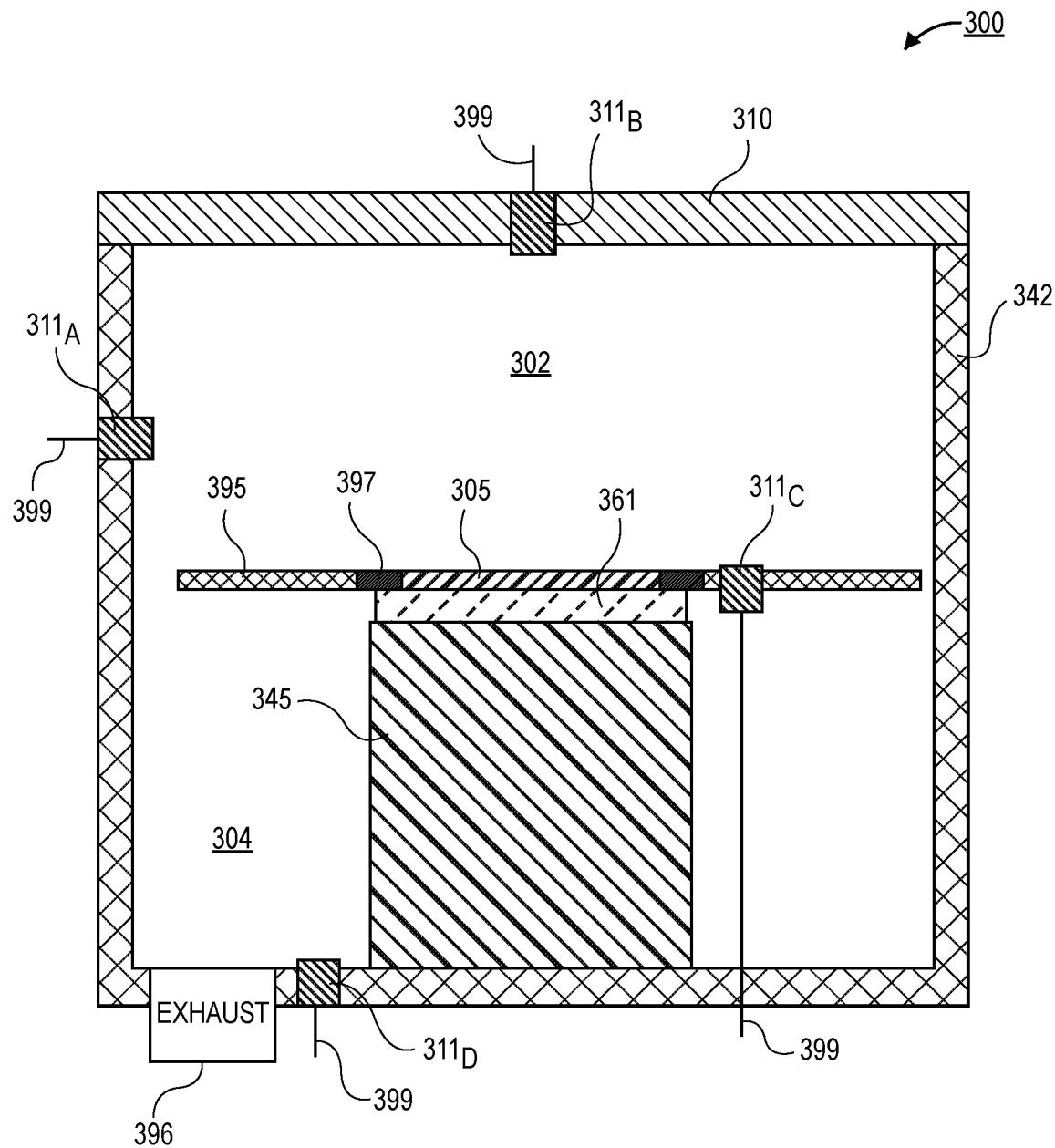
FIG. 3 is a schematic illustration of a processing tool that illustrates exemplary locations where sensor modules may be located, in accordance with an embodiment.

As shown, in FIG. 3, the processing apparatus 300 may comprise a chamber 342. A cathode liner 345 may surround a lower electrode 361. A substrate 305 may be secured to the lower electrode 361. A process ring 397 may surround the substrate 305, and a plasma screen 395 may surround the process ring 397. In an embodiment, a lid assembly 310 may seal the chamber 342. The chamber 342 may include a processing region 302 and an evacuation region 304. The evacuation region 304 may be proximate to an exhaust port 396.

In some embodiments, a sidewall sensor assembly $311_A$ may be located along a sidewall of the chamber 342. In some embodiments, the sidewall sensor assembly $311_A$ passes through the wall of the chamber 342 and is exposed to the processing region 302. In some embodiments, a lid sensor assembly $311_B$ is integrated with the lid assembly 310 and faces the processing region 302. In some embodiments, a process ring sensor assembly $311_C$ is positioned adjacent to the process ring 397. For example, the process ring sensor module $311_C$ may be integrated with the plasma screen 395 that surrounds the process ring 397. In yet another embodiment, an evacuation region sensor assembly $311_D$ may be located in the evacuation region 304. For example, the evacuation region sensor assembly $311_D$ may pass through a bottom surface of the chamber 342. As shown, each of the sensor assemblies 311 includes an electrical lead 399 that exits the chamber 342. As such, real time monitoring with the sensor assemblies 311 may be implemented.

Figure 4B:
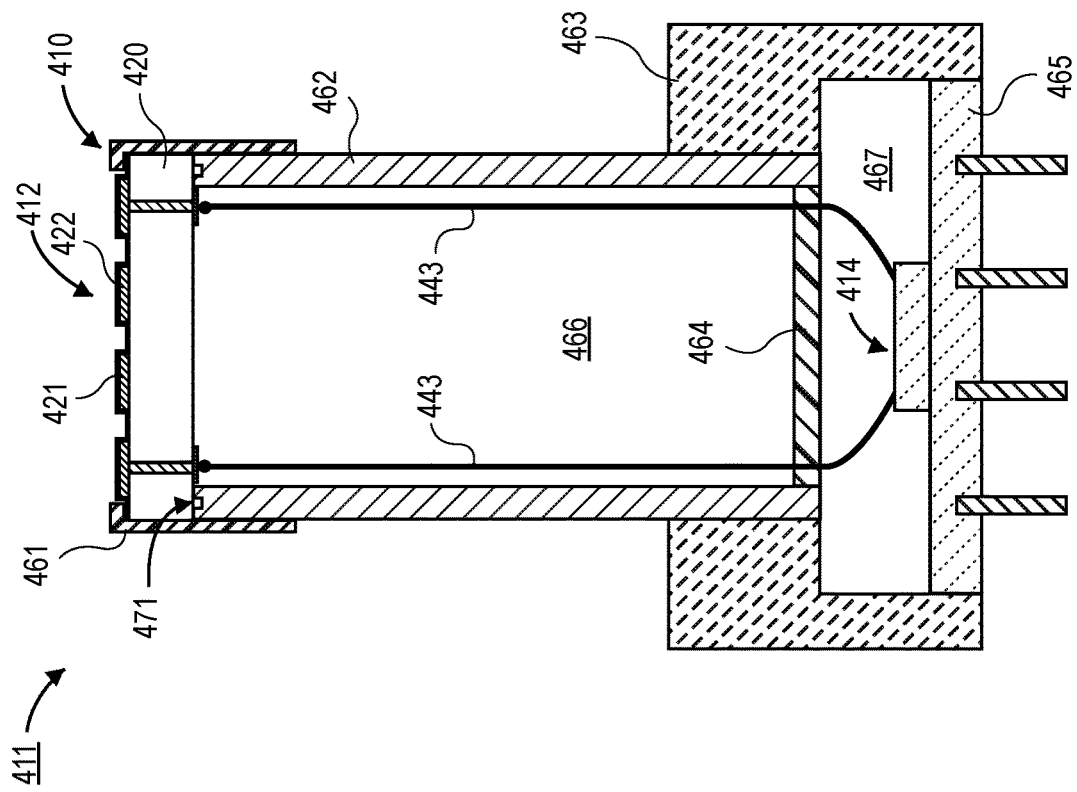
FIG. 4B is a cross-sectional illustration of a sensor assembly for use for monitoring a chamber condition in high temperature environments, in accordance with an embodiment.
Figure 4A:
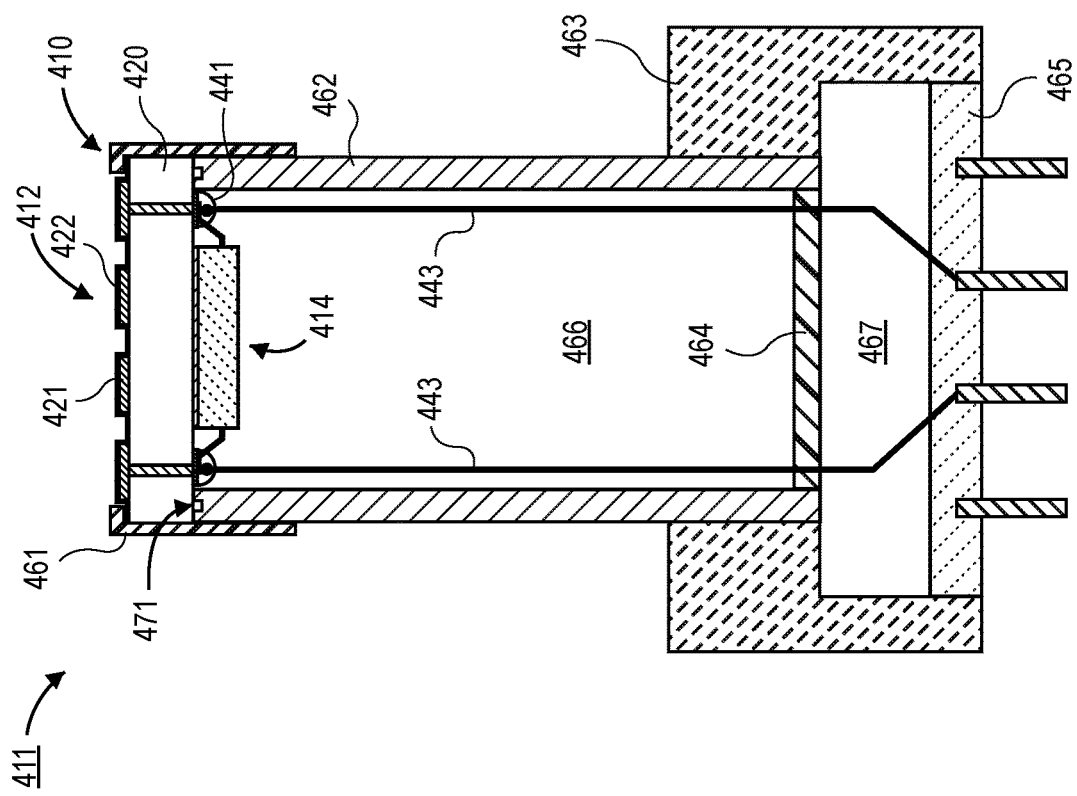
FIG. 4A is a cross-sectional illustration of a sensor assembly for use for monitoring a chamber condition in low temperature environments, in accordance with an embodiment.

Referring now to FIG. 4A, a cross-sectional illustration of a sensor assembly 411 is shown, in accordance with an embodiment. In an embodiment, the sensor assembly 411 may comprise a sensor module 410. The sensor module 410 comprises a sensor 412 and a CDC 414. The sensor 412 comprises a first electrode 421 and a second electrode 422 over a substrate 420. In an embodiment, the CDC 414 is attached to a surface of the substrate 420 opposite from the electrodes 421, 422.

In an embodiment, the sensor assembly 411 further comprises a housing assembly for securing the sensor module 410. For example, the housing assembly may include an vacuum electrical feedthrough 465, a main housing body 463, a shaft 462, and a cap 461. The components illustrated in the sensor housing of FIG. 4A are exemplary in nature. It is to be appreciated that the structure of the individual components may be varied in order to accommodate placements in different locations of the processing tool. Different sensor housing variations will be described in greater detail below.

In an embodiment, the sensor module 410 is secured against an end of the shaft 462 by the cap 461. In some embodiments the cap 461 is welded to the end of the shaft 462. The cap 461 extends over a top surface of the substrate 420 and applies a force against the top surface of the substrate 420 to secure the substrate 420 to the end of the shaft 462. In some embodiments, the end of the shaft 462 may comprise a groove 471. A seal ring (not shown) may be positioned in the groove 471. The substrate 420 compresses the seal ring against the shaft 462 to provide a hermetic seal.

In an embodiment, the cap 461 comprises an opening to expose the capacitor of the sensor module 410 (e.g., the first electrode 421 and the second electrode 422). For example, the top surface of the cap 461 forms a lip that surrounds the perimeter of the capacitor. Accordingly, the capacitor of the sensor module 410 is able to be exposed to the processing environments of a processing tool.

In an embodiment, the shaft 462 is a hollow shaft 462. The shaft 462 may be referred to as a "tube" in some embodiments. The hollow shaft 462 allows for the interconnects 443 from the sensor module 410 to be fed to the vacuum electrical feedthrough 465 in an enclosed environment. As such, the interconnects 443 are not exposed to the processing environment of the processing tool. In an embodiment, the interconnects 443 are secured to the sensor module 410 by solder 441. Such a connection may be suitable for low temperature processing environments (e.g., temperatures lower than the solder melting temperature, such as approximately 200° C. or less). In such an embodiment, the low temperature may also allow for the CDC 414 to be attached to the substrate 420, since the operating temperature of the CDC 414 will likely not be exceeded in such environments.

In an embodiment, an end of the shaft 462 opposite from the sensor module 410 may be sealed by a plate 464. The seal plate 464 may provide a hermetic seal to the interior volume 466 of the shaft 462. In an embodiment, electrical connections through the seal plate 464 allow for interconnects 443 to pass through the plate 464 and continue to the vacuum electrical feedthrough 465.

In an embodiment, the main housing body 463 may mechanically couple the shaft 462 to the vacuum electrical feedthrough 465. For example, the shaft 462 may fit into an internal volume 467 of the main housing body 463. In some embodiments, the shaft 462 is removably coupled to the main housing body 463. The ability to remove the shaft 462 allows for easy replacement of the sensor module 410 (e.g., after a certain duration of time or after significant sensor drift is detected). That is, in some embodiments, the shaft 462, the cap 461, and the sensor module 410 may be considered a "consumable" component. The shaft may be removably coupled to the main housing body by a screw mechanism, or other suitable attachment feature. For example, the outer surface of the end of the shaft 462 and the main housing body 463 may be threaded so that the shaft 462 may be screwed into the main housing body 463. In alternative embodiments, the shaft 462 and the main housing body 463 may be a monolithic part or otherwise permanently attached together.

Referring now to FIG. 4B, a cross-sectional illustration of a sensor assembly 411 is shown, in accordance with an additional embodiment. The sensor assembly 411 in FIG. 4B is optimized for higher temperature environments. Particularly, the CDC 414 is moved away from the substrate 420, and the solder 441 for the interconnects 443 is omitted. In an embodiment, the CDC 414 may be moved to the main housing body 463. That is, the CDC 414 may be positioned in the internal volume 467 of the main housing body 463.

Additionally, in order to not be limited by the melting temperature of a solder, the interconnects 443 may be secured to the pads of the substrate 420 by other architectures. For example, the interconnects 443 may be held against the pads with a spring mechanism (e.g., a poker pin architecture), or the interconnects 443 may be welded to the pads of the substrate 420.

Figure 5A:
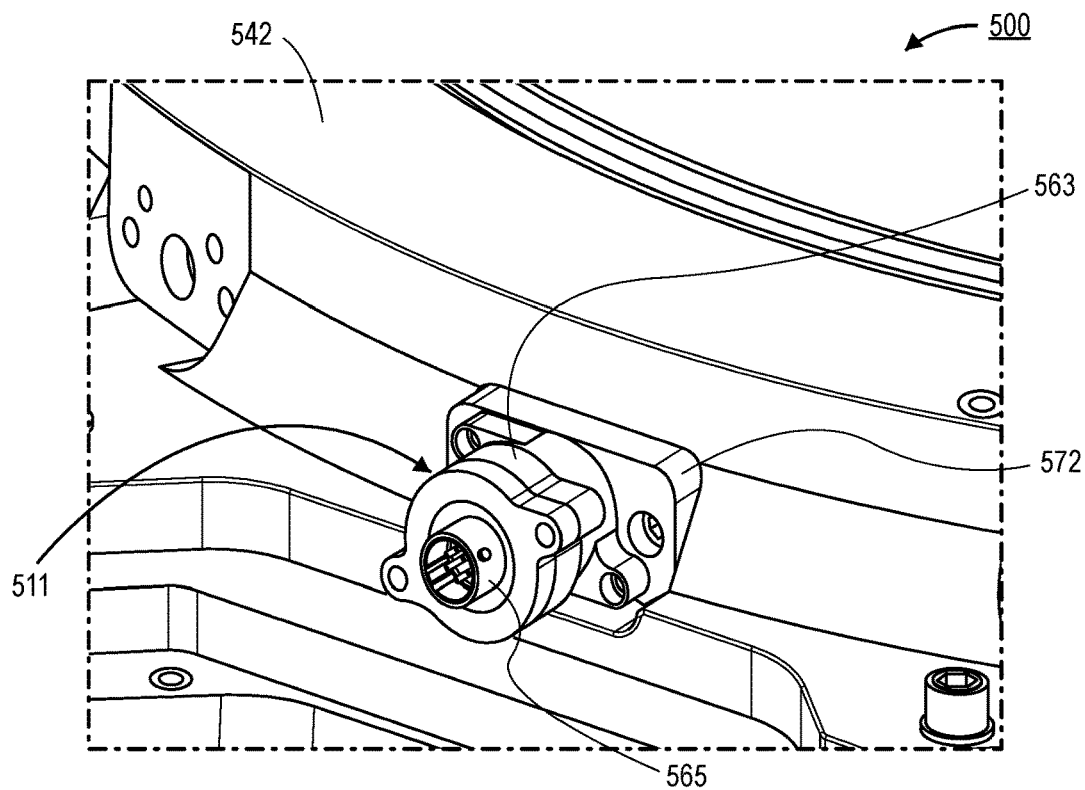
FIG. 5A is a partial perspective illustration of a portion of a processing tool that depicts a sensor housing assembly attached to a chamber wall, in accordance with an embodiment.
Figure 5B:
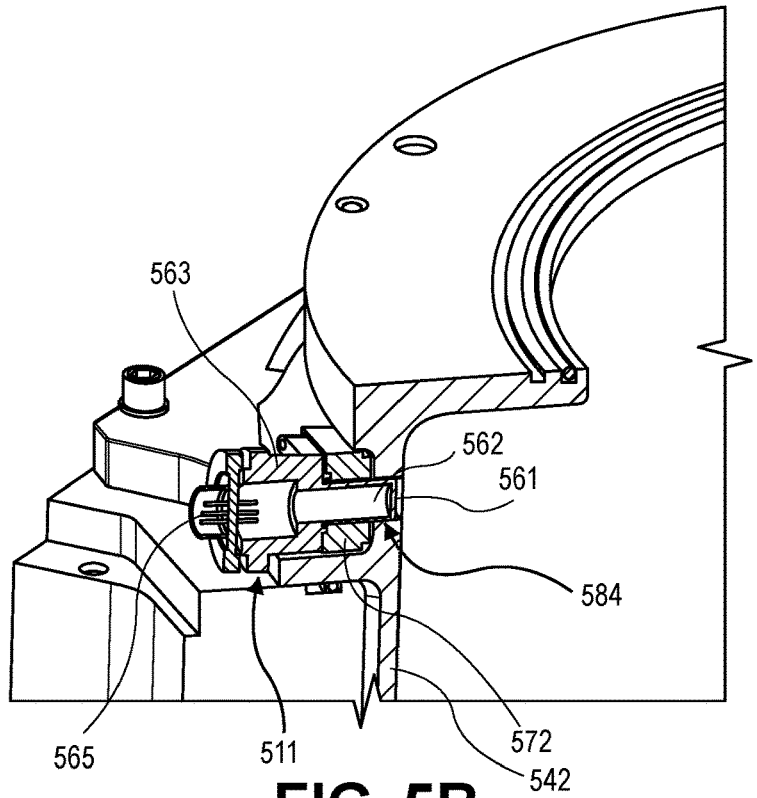
FIG. 5B is a cross-sectional depiction of the sensor housing assembly attached to a chamber wall, in accordance with an embodiment.
Figure 5C:
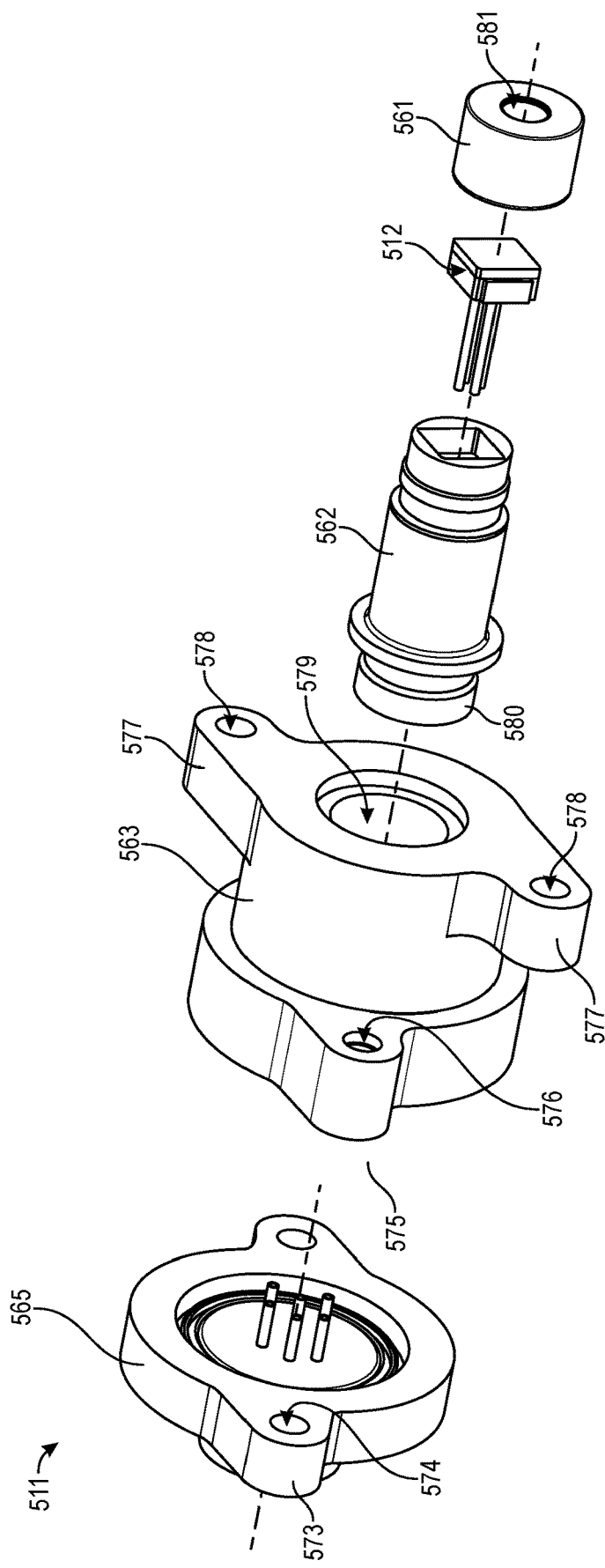
FIG. 5C is an exploded perspective illustration of a sensor housing assembly for attachment to a chamber wall, in accordance with an embodiment.

Referring now to FIGS. 5A-5C, illustrations depicting the integration of a sensor assembly 511 into a sidewall of a chamber 542 of a processing tool 500 are shown, in accordance with a particular embodiment.

Referring now to FIG. 5A, a perspective view illustration of a sensor assembly 511 attached to a wall of a chamber 542 is shown, in accordance with an embodiment. The illustration in FIG. 5A depicts an outer surface of the chamber 542 (i.e., outside of the processing tool 500). In FIG. 5A, the main hosing body 563 and the vacuum electrical feedthrough 565 of the sensor assembly 511 are shown. The remainder of the sensor assembly 511 is obscured by the chamber 542. The main housing body 563 and the vacuum electrical feedthrough 565 may be positioned outside of the chamber 542.

In an embodiment, the main housing body 563 interfaces with a plate 572 that is secured to the chamber 542 around a port (not visible in FIG. 5A). In other embodiments, the plate 572 may be omitted, and the main housing body 563 may be directly attached to the chamber 542.

Referring now to FIG. 5B, a sectional view of FIG. 5A that depicts the port and the components of the sensor assembly 511 that pass into the chamber is shown, in accordance with an embodiment. As shown, the shaft 562 extends through a port 584 through the wall of the chamber 542. The cap 561 fits over the end of the shaft 562 and exposes the sensor (not shown) to an interior volume of the chamber 542.

Referring now to FIG. 5C, an exploded perspective view illustration of the sensor assembly 511 that may be used for a wall sensor is shown, in accordance with an embodiment. The vacuum electrical feedthrough 565 may comprise a flange 573 with a hole 574 through the flange 573. The main housing body 563 may comprise a first flange 575 with a first hole 576. The hole 574 of the vacuum electrical feedthrough 565 may be aligned with the first hole 576 of the main housing body in order to secure the two components together (e.g., with a bolt, a screw, etc.). The flanges 573 and 575 may each have any number of holes in order to secure the two components together.

In an embodiment, the main housing body 563 may further comprise a second flange 577 on an opposite end. The second flange 577 may have a second hole 578. The second hole 578 may be used to secure the main housing body 563 to a plate 572 or directly to the chamber 542. In an embodiment, the second hole 578 may be offset from the first hole 576 in order to provide ease of assembly.

In an embodiment, the shaft 562 comprises an elongated tube. In some embodiments, the shaft 562 comprises a threaded end 580. The threaded end may be screwed into the opening 579 of the main housing body 563 (which may also be threaded) to allow for easy disassembly. As such, once the sensor 512 needs to be replaced, the shaft 562 may be unscrewed and a new shaft (with a new cap 561 and sensor 512) may be screwed onto the main housing body 563.

In an embodiment, the sensor 512 may be positioned between the end of the shaft 562 and the cap 561. The cap 561 may be welded (or affixed in any other manner) to the shaft 562. In an embodiment, the cap 561 comprises an opening 581 in order to expose the sensor 512 to the processing environment. In an embodiment, the main housing body 563 has a low thermal resistance between the housing body 563 and the chamber wall. Additionally, embodiments may also include a main housing body 563 shares a common ground with the chamber wall.

Figure 6B:
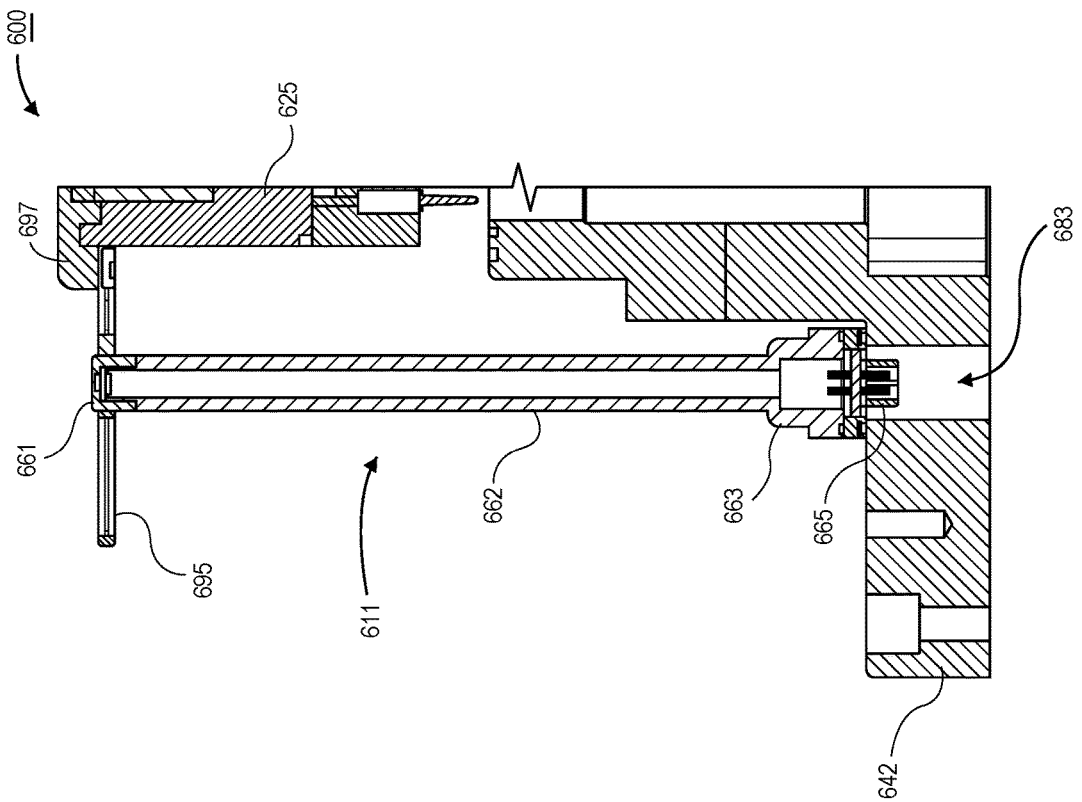
FIG. 6B is a cross-sectional depiction of the sensor housing assembly in FIG. 6A, in accordance with an embodiment.
Figure 6A:
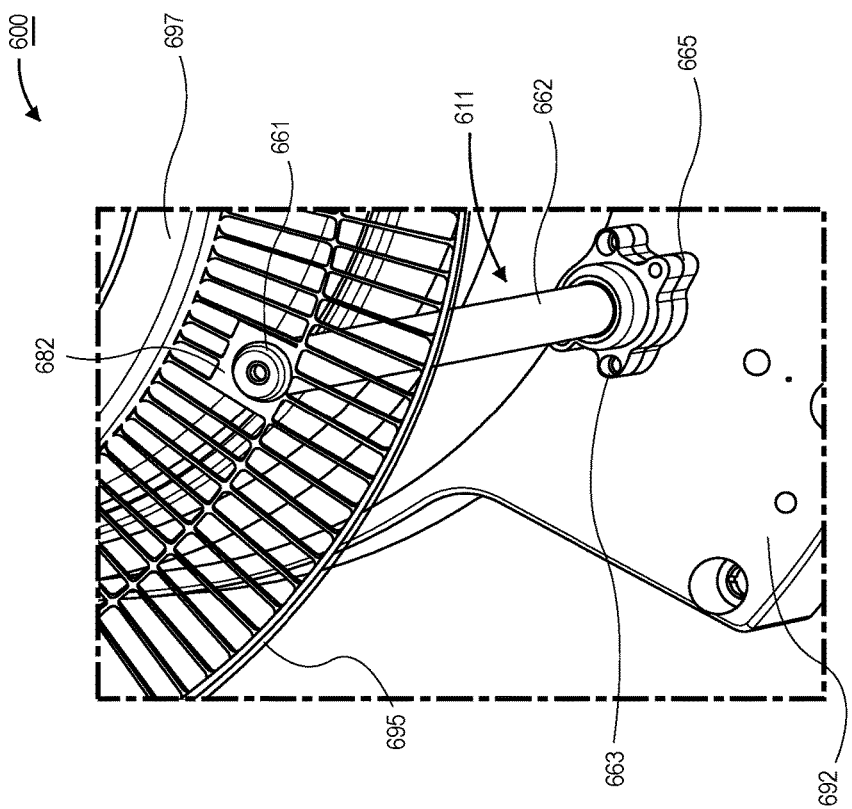
FIG. 6A is a partial perspective illustration of a portion of a processing tool that depicts a sensor housing assembly that positions a sensor module adjacent to a process ring, in accordance with an embodiment.
Figure 6C:
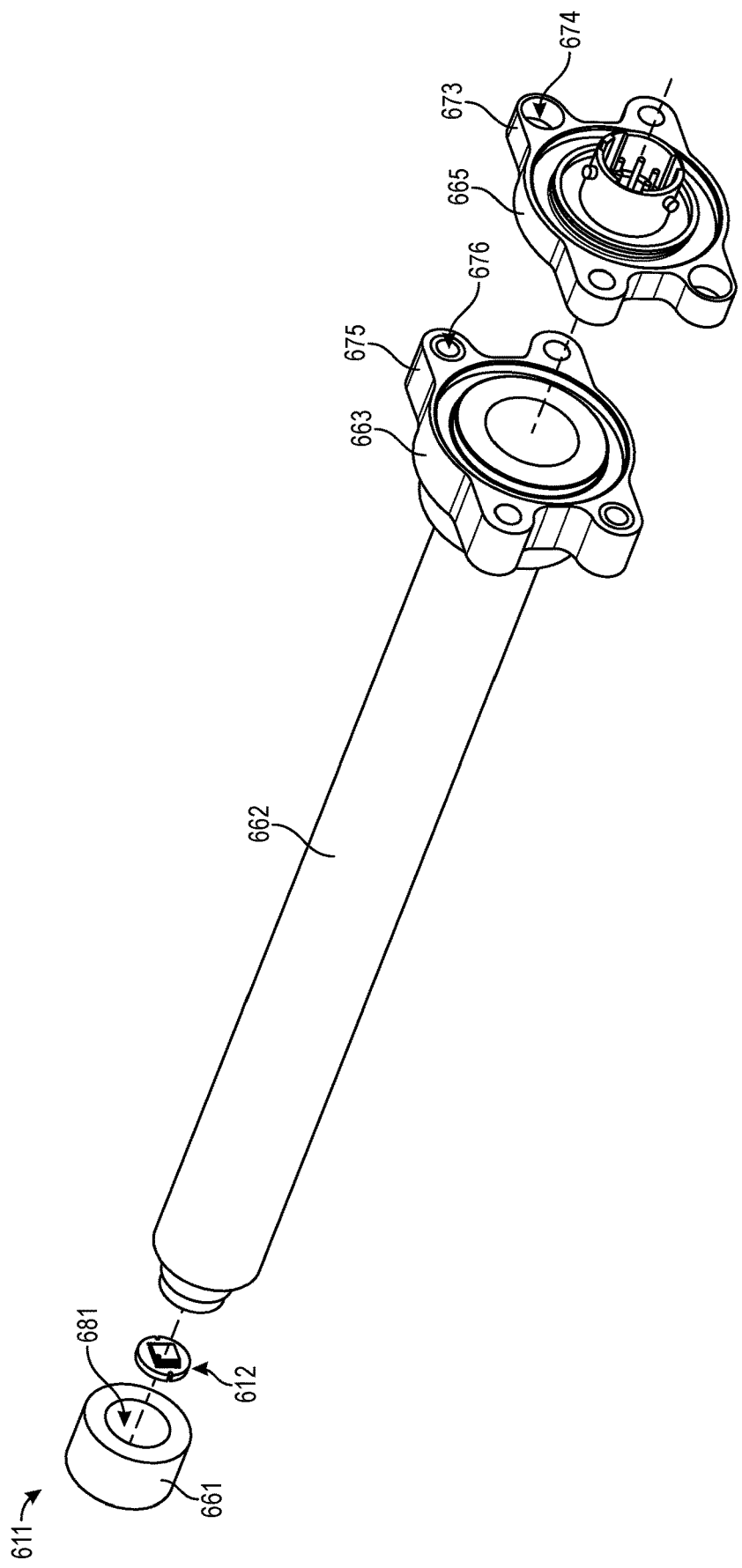
FIG. 6C is an exploded perspective illustration of a sensor housing assembly for positioning a sensor module proximate to a process ring, in accordance with an embodiment.

Referring now to FIGS. 6A-6C, illustrations depicting the integration of a sensor assembly 611 proximate to a process ring 697 within a processing tool 600 are shown, in accordance with a particular embodiment.

Referring now to FIG. 6A, a partial perspective view illustration of a portion of the interior of a processing tool 600 is shown, in accordance with an embodiment. As shown, the sensor assembly 611 extends up from an interior surface of the chamber 642 in order to position the cap 661 adjacent to a process ring 697 that surrounds a substrate (not shown). In the particular embodiment illustrated, the cap 661 is integrated within a plasma screen 695. For example, the plasma screen 695 may include an opening 682 sized to receive the cap 661. In some embodiments, the plasma screen 695 may be omitted or have any desired structure.

In an embodiment, the main housing body 663 may be attached to the interior surface of the chamber 642. The main housing body 663 may be directly attached to the chamber 642, or the vacuum electrical feedthrough 665 may be positioned between the chamber 642 and the main housing body 663. The shaft 662 may extend up vertically from the main housing body 663. The height of the shaft 662 may be suitable in order to position a top surface of the cap 661 so that it is substantially coplanar with a top surface of the process ring 697. However, it is to be appreciated that an offset between the top surface of the cap and the top surface of the process ring 697 may be present in some embodiments.

Referring now to FIG. 6B, a cross-sectional illustration of the processing tool 600 that depicts the structure of the sensor assembly 611 is shown, in accordance with an embodiment. As shown, a port 683 is disposed through a wall (e.g., a bottom surface) of the chamber 642. The vacuum electrical feedthrough 665 may be attached to the interior surface of the chamber 642 and extend into the port 683. That is, a portion of the vacuum electrical feedthrough 665 may be within an interior volume of the chamber 642 and within the port 683. The main housing body 663 is attached to the vacuum electrical feedthrough 665, and the shaft 662 extends vertically away from the main housing body 663. The cap 661 may intersect with the plasma screen 695.

Referring now to FIG. 6C, an exploded perspective view illustration of the sensor assembly 611 is shown, in accordance with an embodiment. As shown, the vacuum electrical feedthrough 665 may comprise a flange 673 with a hole 674. A matching flange 675 and hole 676 is provided on the main housing body in order to secure the two components together (e.g., by bolt, screw, or the like). In the illustrated embodiment, the flanges 675 and 673 have four holes 676, 674 each. However, it is to be appreciated that any number of holes 676, 674 may be included on the flanges 675, 673.

In the illustrated embodiment, the shaft 662 extends out from the main housing body 663. In some embodiments, the shaft 662 and the main housing body 663 are shown as a monolithic part (or otherwise permanently attached together). However, it is to be appreciated that in some embodiments, the shaft 662 is removable secured to the main housing body 663 (e.g., with a screw mechanism or the like).

In an embodiment, the sensor 612 is disposed at the opposite end of the shaft 662 from the main housing body 663. The sensor 612 is secured against the shaft 662 by the cap 661. In an embodiment, the cap 661 includes an opening 681 that allows for the sensor 612 to be exposed to the processing environment. In an embodiment, the main housing body 663 has a low thermal resistance between the housing body 663 and the plasma screen 695. Additionally, embodiments may also include a main housing body 663 that shares a common ground with the plasma screen 695.

Figure 7B:
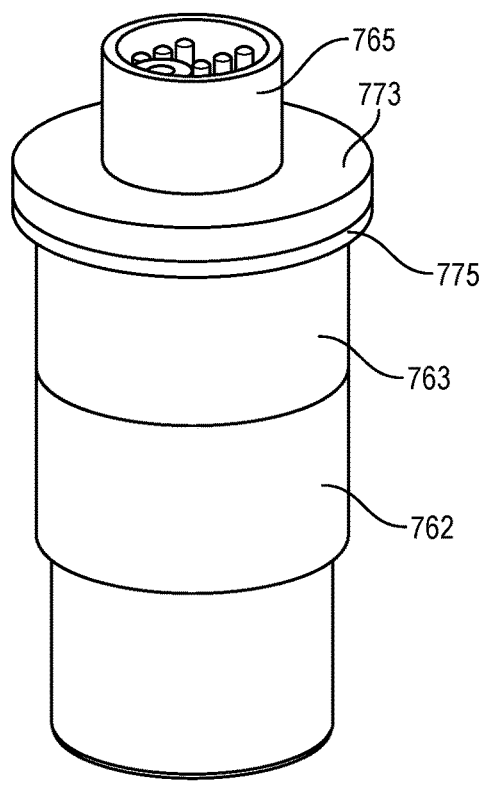
FIG. 7B is a perspective view illustration of a sensor housing assembly that is integrated into a chamber lid, in accordance with an embodiment.
Figure 7C:
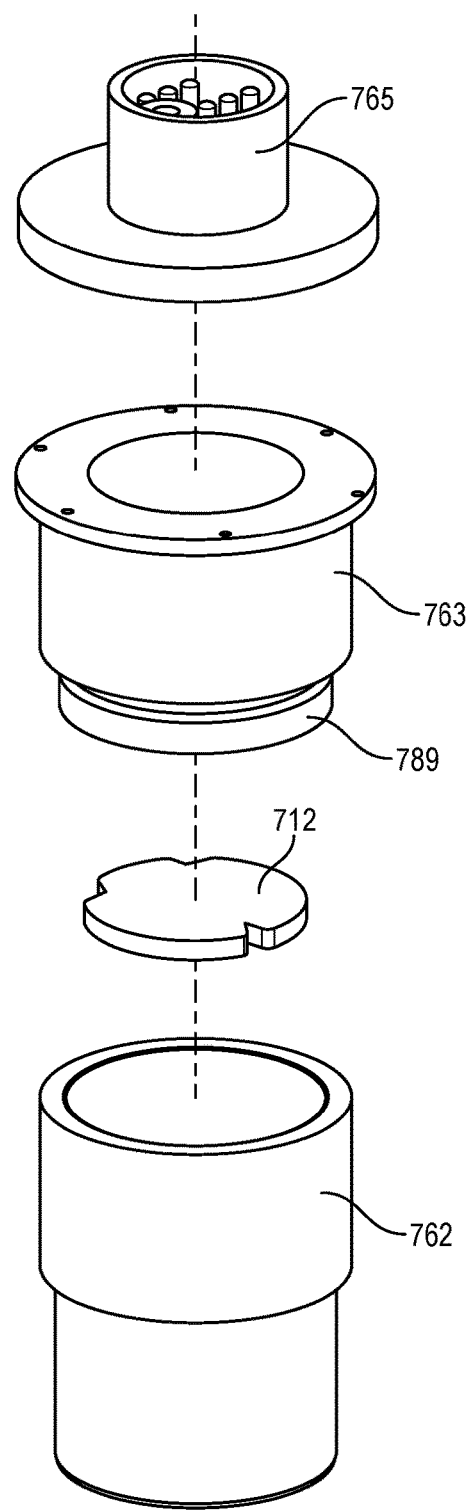
FIG. 7C is an exploded perspective illustration of a sensor housing assembly that is integrated into a chamber lid, in accordance with an embodiment.

Referring now to FIGS. 7A-7C, illustrations depicting the integration of a sensor assembly 711 into a lid assembly 708 of a processing tool 700 are shown, in accordance with a particular embodiment.

Referring now to FIG. 7A, a sectional view illustration of a portion of a lid assembly 708 of a processing tool 700 is shown, in accordance with an embodiment. In an embodiment, the lid assembly 708 comprises a central nozzle 707 through which an electrical feed 706 is provided. In an embodiment, the electrical feed 706 is connected to the vacuum electrical feedthrough 765. The vacuum electrical feedthrough 765 may seal the bottom of the central nozzle 707. That is, a volume below the bottom surface of the central nozzle 707 may be held at vacuum pressure, and a volume above bottom surface of the central nozzle 707 may be at atmospheric pressure.

In an embodiment, the main housing body 763 may interface with the vacuum electrical feedthrough 765 in the vacuum side of the lid assembly 708. The shaft 762 may be attached to the main housing body 763 and extend down into the processing region of the processing tool 700. In an embodiment, the sensor 712 is positioned at the bottom of the shaft 762, and secured in place by the cap 761. The cap 761 in FIG. 7A may extend from the sensor 712 all the way back to the bottom surface of the central nozzle 707. That is, the cap 761 may surround both the shaft 762 and the main housing body 763.

Referring now to FIG. 7B, a perspective view illustration of a portion of the sensor assembly 711 is shown, in accordance with an embodiment. The cap 761 is omitted from FIG. 7B for clarity. As shown, the vacuum electrical feedthrough 765 may include a flange 773. The flange 773 may be secured against the bottom surface of the central nozzle 707 of the lid assembly 708 (e.g., with a bolt or other means). In an embodiment, the main housing body 763 may also comprise a flange 775. The flange 775 and the flange 773 may be secured together by bolts that pass through holes (not shown) in the flanges 775 and 773. In an embodiment, the shaft 762 may be removably attached to the main housing body 763 (e.g., with a screw mechanism or the like).

Referring now to FIG. 7C, an exploded perspective view illustration of the sensor assembly 711 is shown, in accordance with an embodiment. Similar to FIG. 7B, the cap 761 is omitted for clarity. As shown, the vacuum electrical feedthrough 765 interfaces with the main housing body 763. In an embodiment, the main housing body 763 may include a protrusion 789. The outer surface of the protrusion 789 may be threaded, and an inner surface of the shaft 762 may be threaded. That is, in some embodiments, the main housing body 763 may be the male component and the shaft 762 may be the female component for a male-female coupling arrangement. In an embodiment, the sensor 712 is secured against the shaft 762 by the cap (not shown). In an embodiment, the main housing body 763 has a low thermal resistance between the housing body 763 and the lid. Additionally, electrical output signals from the sensors 712 may be electrically shielded from the RF coils above the lid. As such, the shaft 762, the main housing body 763, and the cap (not shown) may be RF grounded. In an embodiment, the RF grounding may be implemented by a common ground across the shaft 762, the main housing body 763, and the cap (not shown).

Figure 8A:
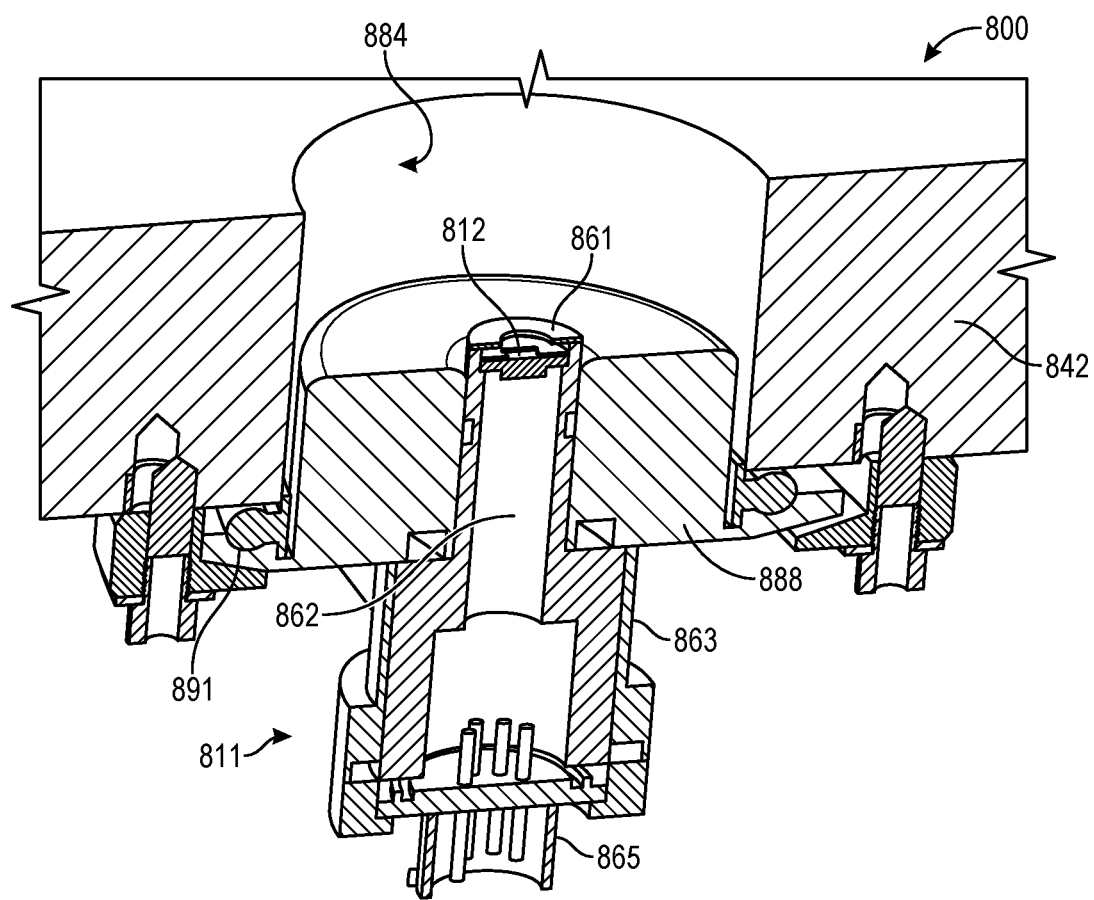
FIG. 8A is a sectional illustration of a portion of a processing tool that depicts a sensor housing assembly passing through a port in the evacuation region of the processing tool, in accordance with an embodiment.
Figure 8C:
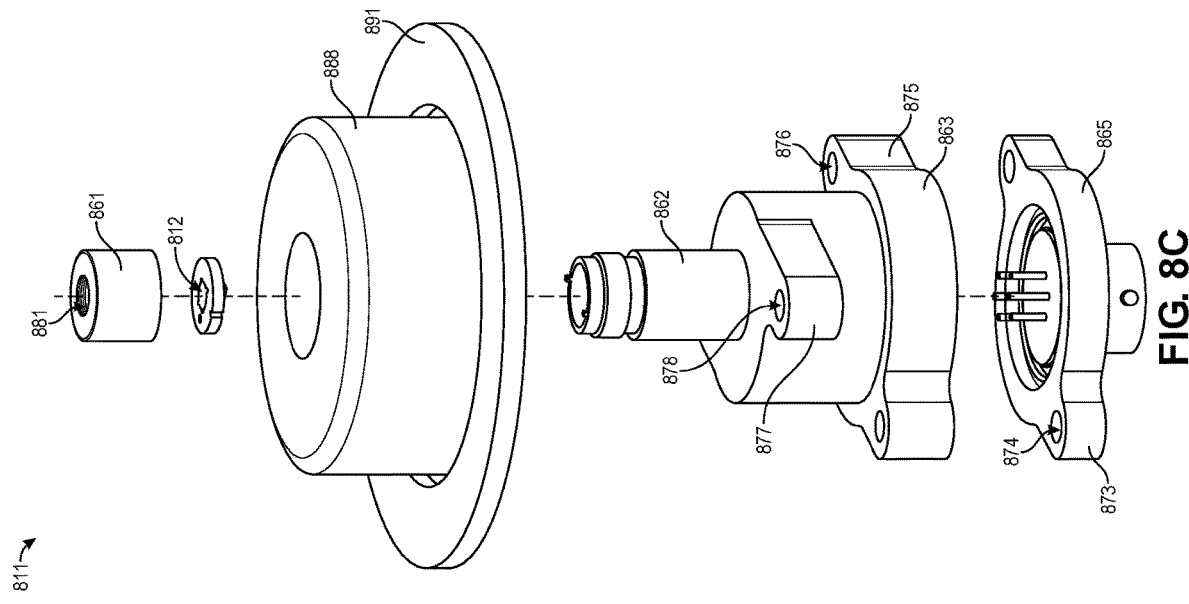
FIG. 8C is an exploded perspective illustration of a sensor housing assembly that is positioned in the evacuation region of a processing tool, in accordance with an embodiment.
Figure 8B:
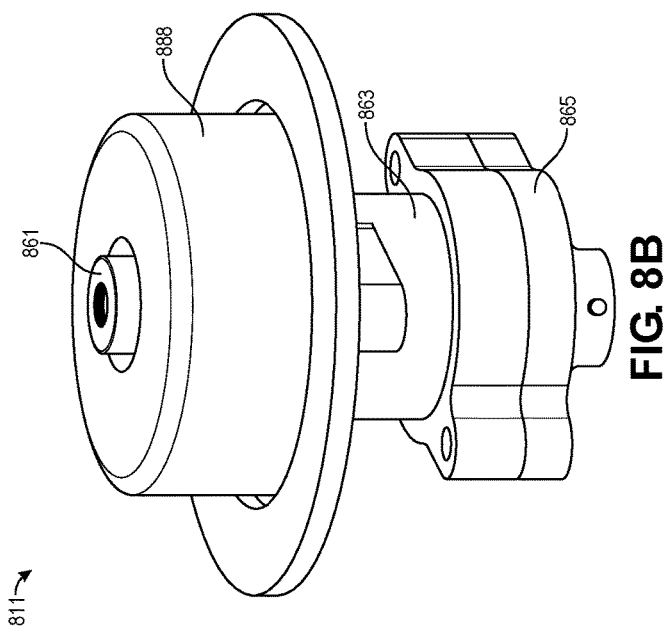
FIG. 8B is a perspective view illustration of the sensor housing assembly in FIG. 8A, in accordance with an embodiment.

Referring now to FIGS. 8A-8C, illustrations depicting the integration of a sensor assembly 811 into bottom surface of a chamber 842 of a processing tool 800 are shown, in accordance with a particular embodiment.

Referring now to FIG. 8A, a partial sectional illustration of a bottom surface of a chamber 842 of a processing tool 800 is shown, in accordance with an embodiment. The bottom surface of the chamber 842 may have a port 884. The port 884 may allow access to an internal region of the processing tool 800. For example, the port 884 may provide access to an evacuation region proximate to the exhaust system (not shown) of the processing tool 800.

In an embodiment, a sensor assembly 811 may be inserted into the port 884. The sensor assembly 811 may comprise a vacuum electrical feedthrough 865, a main housing body 863, a shaft 862, a sensor 812, and a cap 861. In an embodiment, the main housing body 863 and the vacuum electrical feedthrough 865 may be positioned outside of the chamber 842 and the shaft 862 may extend into the port 884. In some embodiments, the shaft 862 may not extend entirely through the port 884, while in other embodiments, the shaft 862 does extend completely through the port 884. For example, the shaft 862 may extend through the port 884 so that the sensor 812 is substantially coplanar with an interior surface of the chamber 842.

In an embodiment, the port 884 may have a dimension (e.g., diameter) that is larger than a dimension (e.g., outer diameter) of the shaft 862. Accordingly, an adapter 888 may be used to completely fill the port 884. The adapter 888 may be secured to the chamber 842 by a flange 891. The sensor assembly 811 may be secured to the adapter 888 (e.g., with one or more bolts or screws (not shown) connecting the adapter 888 to the main housing body 863).

Referring now to FIG. 8B, a perspective view illustration of the sensor assembly 811 and the adapter 888 is shown, in accordance with an embodiment. In an embodiment, the adapter 888 is seated around the shaft 862 (not visible). The cap 861 (and the sensor 812, which is not visible) may extend above the top surface of the adapter 888.

Referring now to FIG. 8C, an exploded perspective illustration of the sensor assembly 811 is shown, in accordance with an embodiment. In an embodiment, the vacuum electrical feedthrough 865 may comprise a flange 873. The flange 873 may comprise one or more holes 874. In an embodiment, the main housing body 863 may comprise a first flange 875 with one or more first holes 876. The first holes 876 of the first flange 875 may be aligned with the one or more holes 874 of the vacuum electrical feedthrough 865 in order to allow the vacuum electrical feedthrough 865 and the main housing body 863 to be coupled together.

In an embodiment, the main housing body 863 may further comprise a second flange 877 on an opposite end main housing body 863 from the first flange 875. In an embodiment, the second flange 877 may comprise one or more second holes 878. In an embodiment, the second flange 877 may be used to couple the main housing body 863 to the flange 891 of the adapter 888. Holes through the adapter flange 891 are omitted, but it is to be appreciated that holes in the flange 891 may be aligned with the second holes 878 in order to receive a bolt, a screw, or the like.

In the illustrated embodiment, the shaft 862 is shown as being affixed to the main housing body 863. The shaft 862 and the main housing body 863 may be a monolithic structure, or the shaft 862 may be removably coupled to the main housing body 863 (e.g., with a screw mechanism). In an embodiment, the sensor 812 may be secured against an end of the shaft 862 by the cap 861. The cap 861 comprises an opening 881 that exposes the sensor 812 to the processing environment (e.g., the evacuation region). In an embodiment, the main housing body 863 has a low thermal resistance between the housing body 863 and the chamber body 800. Additionally, embodiments may also include a main housing body 863 that shares a common ground with the chamber body 800.

In FIGS. 5A-8C, various sensor assembly configurations are provided. It is to be appreciated that such sensor assemblies may be integrated with any chamber architecture. Also more than one sensor can be distributed throughout the chamber to monitor chamber depositions and removal as well as temperature at different locations. For example, the sensors can also be implemented on lid across the lid in addition to the center; the sensors can also be located on the wall at different position vertically; the sensors can also be positioned at three locations on the ring with 120 degree apart for the ring erosion uniformity monitor; similarly the sensors can also be placed at more than one locations near the vacuum ports at bottom of the chamber. An example of one such chamber architecture in which various sensor assemblies, such as those described above, may be integrated is described with respect to FIGS. 9A and 9B. In an embodiment, a single sensor assembly may be integrated into the processing apparatus 900, or two or more sensor assemblies may be integrated into the processing apparatus 900. Additionally there may two or more of a single type of sensor assembly integrated into the processing apparatus 900. For example, two or more wall sensor assemblies may be integrated into the processing apparatus 900.

Figure 9A:
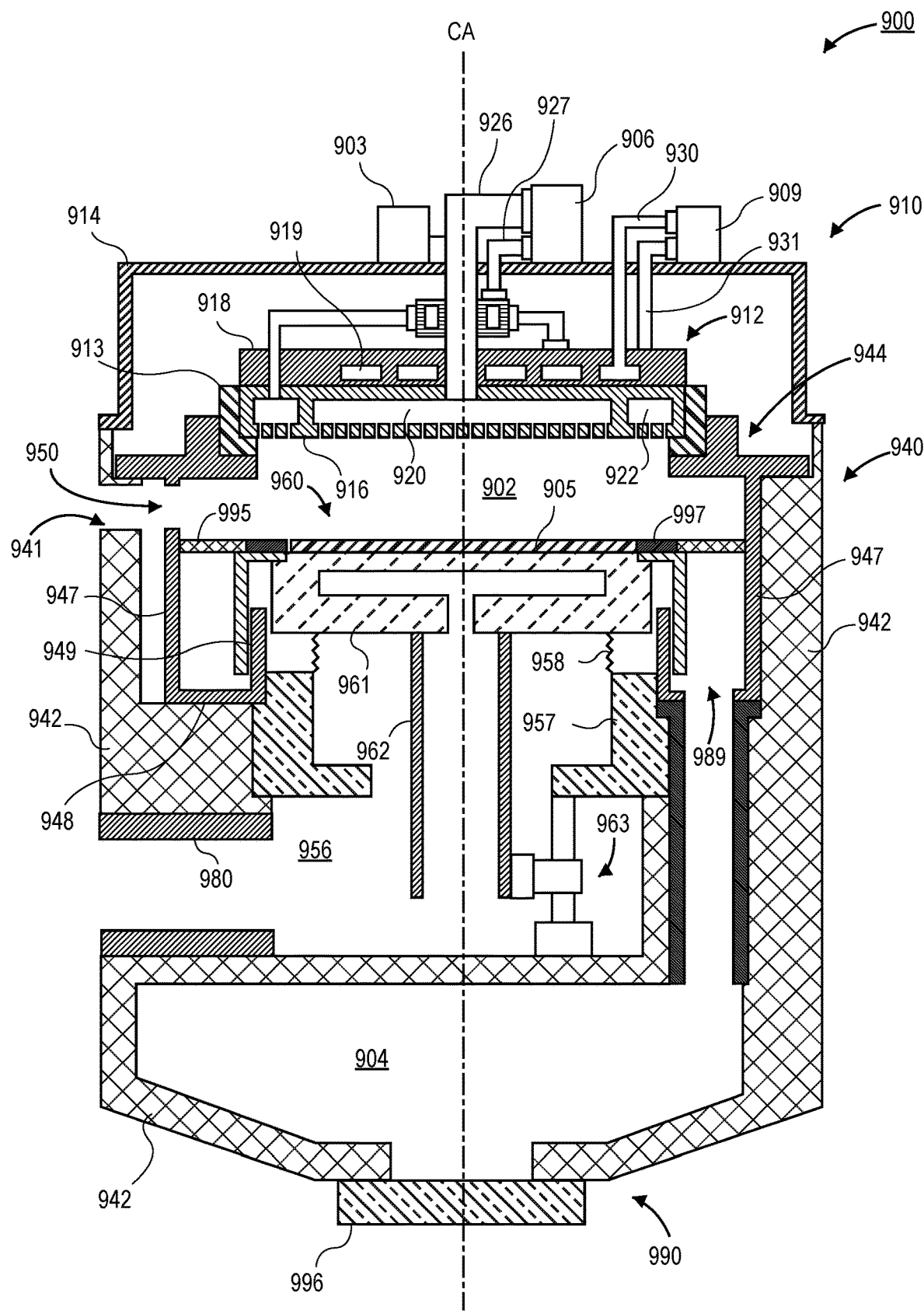
FIG. 9A is a cross-sectional illustration of a processing tool that may comprises one or more sensor assemblies, in accordance with an embodiment.

Referring now to FIG. 9A, a schematic, cross-sectional view of a plasma processing apparatus 900 that comprises one or more sensor assemblies, such as those described herein, is shown, in accordance with an embodiment. The plasma processing apparatus 900 may be a plasma etch chamber, a plasma enhanced chemical vapor deposition chamber, a physical vapor deposition chamber, a plasma treatment chamber, an ion implantation chamber, or other suitable vacuum processing chamber. As shown in FIG. 9A, the plasma processing apparatus 900 generally includes a chamber lid assembly 910, a chamber body assembly 940, and an exhaust assembly 990, which collectively enclose a processing region 902 and an evacuation region 904. In practice, processing gases are introduced into the processing region 902 and ignited into a plasma using RF power. A substrate 905 is positioned on a substrate support assembly 960 and exposed to the plasma generated in the processing region 902 to perform a plasma process on the substrate 905, such as etching, chemical vapor deposition, physical vapor deposition, implantation, plasma annealing, plasma treating, abatement, or other plasma processes. Vacuum is maintained in the processing region 902 by the exhaust assembly 990, which removes spent processing gases and byproducts from the plasma process through the evacuation region 904.

The lid assembly 910 generally includes an upper electrode 912 (or anode) isolated from and supported by the chamber body assembly 940 and a chamber lid 914 enclosing the upper electrode 912. The upper electrode 912 is coupled to an RF power source 903 via a conductive gas inlet tube 926. The conductive gas inlet tube 926 is coaxial with a central axis of the chamber body assembly 940 so that both RF power and processing gases are symmetrically provided. The upper electrode 912 includes a showerhead plate 916 attached to a heat transfer plate 918. The showerhead plate 916, the heat transfer plate 918, and the gas inlet tube 926 are all fabricated from an RF conductive material, such as aluminum or stainless steel.

The showerhead plate 916 has a central manifold 920 and one or more outer manifolds 922 for distributing processing gasses into the processing region 902. The one or more outer manifolds 922 circumscribe the central manifold 920. The central manifold 920 receives processing gases from a gas source 906 through the gas inlet tube 926, and the outer manifold(s) 922 receives processing gases, which may be the same or a different mixture of gases received in the central manifold 920, from the gas source 906 through gas inlet tube(s) 927. The dual manifold configuration of the showerhead plate 916 allows improved control of the delivery of gases into the processing region 902. The multi-manifold showerhead plate 916 enables enhanced center to edge control of processing results as opposed to conventional single manifold versions.

A heat transfer fluid is delivered from a fluid source 909 to the heat transfer plate 918 through a fluid inlet tube 930. The fluid is circulated through one or more fluid channels 919 disposed in the heat transfer plate 918 and returned to the fluid source 909 via a fluid outlet tube 931. Suitable heat transfer fluids include water, water-based ethylene glycol mixtures, a perfluoropolyether (e.g., Galden® fluid), oil-based thermal transfer fluids, or similar fluids.

The chamber body assembly 940 includes a chamber body 942 fabricated from a conductive material resistant to processing environments, such as aluminum or stainless steel. The substrate support assembly 960 is centrally disposed within the chamber body 942 and positioned to support the substrate 905 in the processing region 902 symmetrically about the central axis (CA). The substrate support assembly 960 may also support a process ring 997 that surrounds the substrate 905. The chamber body 942 includes a ledge that supports an outer flange of an upper liner assembly 944. The upper liner assembly 944 may be constructed from a conductive, process compatible material, such as aluminum, stainless steel, and/or yttria (e.g., yttria coated aluminum). In practice, the upper liner assembly 944 shields the upper portion of the chamber body 942 from the plasma in the processing region 902 and is removable to allow periodic cleaning and maintenance. An inner flange of the upper liner assembly 944 supports the upper electrode 912. An insulator 913 is positioned between the upper liner assembly 944 and the upper electrode 912 to provide electrical insulation between the chamber body assembly 940 and the upper electrode 912.

The upper liner assembly 944 includes an outer wall 947 attached to the inner and outer flanges, a bottom wall 948, and an inner wall 949. The outer wall 947 and inner wall 949 are substantially vertical, cylindrical walls. The outer wall 947 is positioned to shield chamber body 942 from plasma in the processing region 902, and the inner wall 949 is positioned to at least partially shield the side of the substrate support assembly 960 from plasma in the processing region 902. The bottom wall 948 joins the inner and outer walls (949, 947) except in certain regions where evacuation passages 989 are formed.

The processing region 902 is accessed through a slit valve tunnel 941 disposed in the chamber body 942 that allows entry and removal of the substrate 905 into/from the substrate support assembly 960. The upper liner assembly 944 has a slot 950 disposed there through that matches the slit valve tunnel 941 to allow passage of the substrate 905 there through. A door assembly (not shown) closes the slit valve tunnel 941 and the slot 950 during operation of the plasma processing apparatus.

The substrate support assembly 960 generally includes lower electrode 961 (or cathode) and a hollow pedestal 962, the center of which the central axis (CA) passes through, and is supported by a central support member 957 disposed in the central region 956 and supported by the chamber body 942. The central axis (CA) also passes through the center of the central support member 957. The lower electrode 961 is coupled to the RF power source 903 through a matching network (not shown) and a cable (not shown) routed through the hollow pedestal 962. When RF power is supplied to the upper electrode 912 and the lower electrode 961, an electrical field formed there between ignites the processing gases present in the processing region 902 into a plasma.

The central support member 957 is sealed to the chamber body 942, such as by fasteners and O-rings (not shown), and the lower electrode 961 is sealed to the central support member 957, such as by a bellows 958. Thus, the central region 956 is sealed from the processing region 902 and may be maintained at atmospheric pressure, while the processing region 902 is maintained at vacuum conditions.

An actuation assembly 963 is positioned within the central region 956 and attached to the chamber body 942 and/or the central support member 957. The actuation assembly 963 provides vertical movement of the lower electrode 961 relative to the chamber body 942, the central support member 957, and the upper electrode 912. Such vertical movement of the lower electrode 961 within the processing region 902 provides a variable gap between the lower electrode 961 and the upper electrode 912, which allows increased control of the electric field formed there between, in turn, providing greater control of the density in the plasma formed in the processing region 902. In addition, since the substrate 905 is supported by the lower electrode 961, the gap between the substrate 905 and the showerhead plate 916 may also be varied, resulting in greater control of the process gas distribution across the substrate 905.

In one embodiment, the lower electrode 961 is an electrostatic chuck, and thus includes one or more electrodes (not shown) disposed therein. A voltage source (not shown) biases the one or more electrodes with respect to the substrate 905 to create an attraction force to hold the substrate 905 in position during processing. Cabling coupling the one or more electrodes to the voltage source is routed through the hollow pedestal 962 and out of the chamber body 942 through one of the plurality of access tubes 980.

Figure 9B:
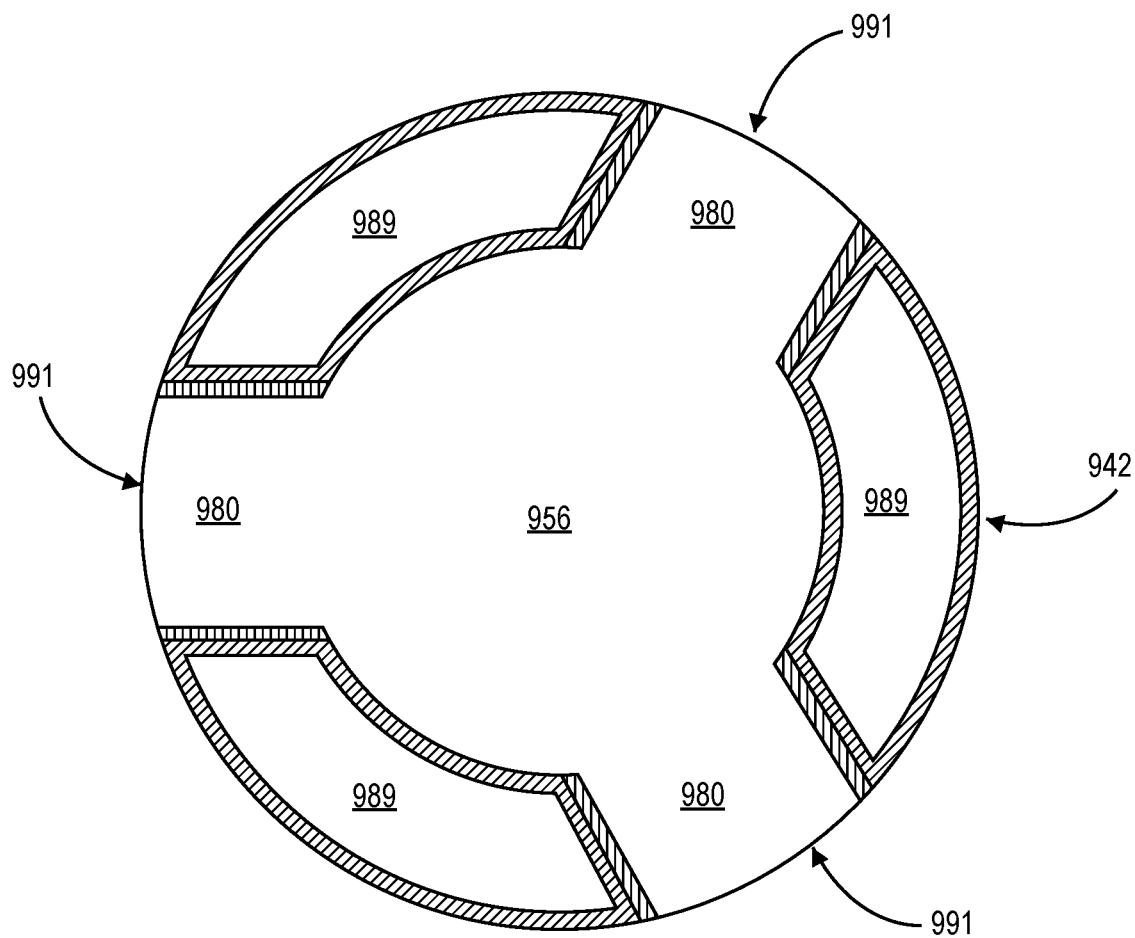
FIG. 9B is a cross-sectional illustration of the processing tool in FIG. 9A that depicts the symmetric layout of access tubes and evacuation passages, in accordance with an embodiment.

FIG. 9B is a schematic depiction of the layout of the access tubes 980 within spokes 991 of the chamber body assembly 940. The spokes 991 and access tubes 980 are symmetrically arranged about the central axis (CA) of the processing apparatus 900 in a spoke pattern as shown. In the embodiment shown, three identical access tubes 980 are disposed through the chamber body 942 into the central region 956 to facilitate supply of a plurality of tubing and cabling from outside of the chamber body 942 to the lower electrode 961. Each of the spokes 991 are adjacent to an evacuation passage 989 that fluidically couples the processing region 902 above the central region 956 to the evacuation region 904 below the central region 956. The symmetrical arrangement of the access tubes 980 further provides electrical and thermal symmetry in the chamber body 942, and particularly in the processing region 902, in order to allow greater more uniform plasma formation in the processing region 902 and improved control of the plasma density over the surface of the substrate 905 during processing.

Similarly, the evacuation passages 989 are positioned in the upper liner assembly 944 symmetrically about the central axis (CA). The evacuation passages 989 allow evacuation of gases from the processing region 902 through the evacuation region 904 and out of the chamber body 942 through an exhaust port 996. The exhaust port 996 is centered about the central axis (CA) of the chamber body assembly 940 such that the gases are evenly drawn through the evacuation passages 989.

Referring again to FIG. 9A, a conductive, mesh liner 995 is positioned on the upper liner assembly 944. The mesh liner 995 may be constructed from a conductive, process compatible material, such as aluminum, stainless steel, and/or yttria (e.g., yttria coated aluminum). The mesh liner 995 may have a plurality of apertures (not shown) formed there through. The apertures may be positioned symmetrically about a center axis of the mesh liner 995 to allow exhaust gases to be drawn uniformly there through, which in turn, facilitates uniform plasma formation in the processing region 902 and allows greater control of the plasma density and gas flow in the processing region 902. In one embodiment, the central axis of the mesh liner 995 is aligned with the central axis (CA) of the chamber body assembly 940.

The mesh liner 995 may be electrically coupled to the upper liner assembly 944. When an RF plasma is present within the processing region 902, the RF current seeking a return path to ground may travel along the surface of the mesh liner 995 to the outer wall 947 of the upper liner assembly 944. Thus, the annularly symmetric configuration of the mesh liner 995 provides a symmetric RF return to ground and bypasses any geometric asymmetries of the upper liner assembly 944.

In an embodiment, the one or more sensor assemblies may be located at various locations throughout the processing apparatus 900. For example, a sensor assembly may be located in one or more locations, such as, but not limited to, along a sidewall of the chamber 942, in the evacuation region 904, adjacent to the process ring 997 (e.g., integrated into the mesh liner 995), or integrated with the lid assembly 910. Accordingly, detection of various chamber conditions in multiple locations through the processing apparatus 900 may be determined. The chamber conditions supplied by the one or more sensor assemblies may be used to modify one or more parameters, such as, for example, processing recipe parameters, cleaning schedules for the processing apparatus 900, component replacement determinations, and the like.

While the processing apparatus 900 in FIGS. 9A and 9B provides a specific example of a tool that may benefit from the inclusion of sensor assemblies such as those disclosed herein, it is to be appreciated that embodiments are not limited to the particular construction of FIGS. 9A and 9B. That is, many different plasma chamber constructions, such as, but not limited to those used in the microelectronic fabrication industry, may also benefit from the integration of sensor assemblies, such as those disclosed herein.

Figure 10:
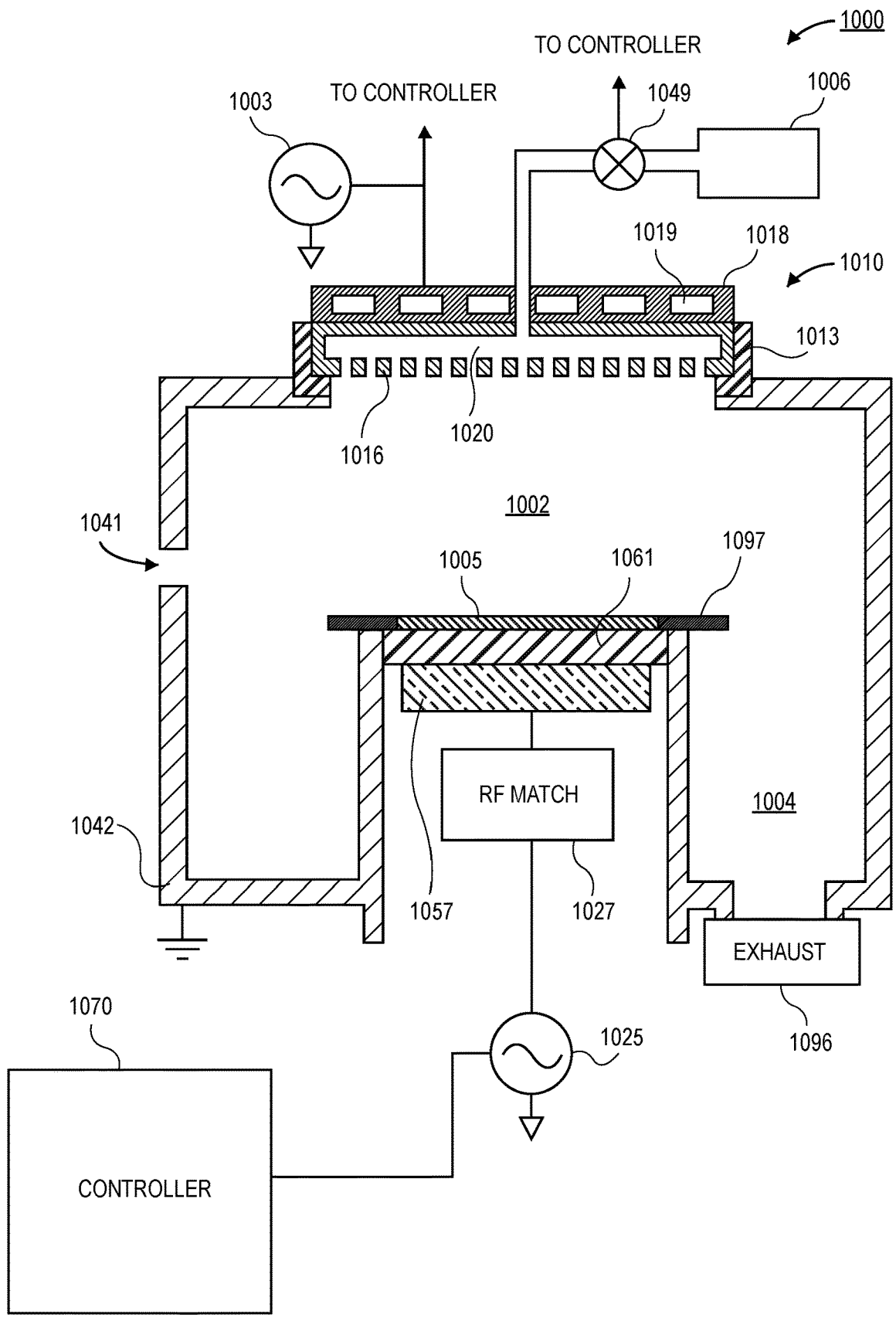
FIG. 10 is a cross-sectional illustration of a processing too that may comprise one or more sensor assemblies, in accordance with an embodiment.

For example, FIG. 10 is a cross-sectional illustration of a processing apparatus 1000 that can include one or more capacitive sensor assemblies such as those described above, in accordance with an embodiment. The plasma processing apparatus 1000 may be a plasma etch chamber, a plasma enhanced chemical vapor deposition chamber, a physical vapor deposition chamber, a plasma treatment chamber, an ion implantation chamber, or other suitable vacuum processing chamber.

Processing apparatus 1000 includes a grounded chamber 1042. In some instances, the chamber 1042 may also comprise a liner (not shown) to protect the interior surfaces of the chamber 1042. The chamber 1042 may comprise a processing region 1002 and an evacuation region 1004. The chamber 1042 may be sealed with a lid assembly 1010. Process gases are supplied from one or more gas sources 1006 through a mass flow controller 1049 to the lid assembly 1010 and into the chamber 1005. An exhaust port 1096 proximate to the evacuation region 1004 may maintain a desired pressure within the chamber 1042 and remove byproducts from processing in the chamber 1042.

The lid assembly 1010 generally includes an upper electrode comprising a showerhead plate 1016 and a heat transfer plate 1018. The lid assembly 1010 is isolated from the chamber 1042 by an insulating layer 1013. The upper electrode is coupled to a source RF generator 1003 through a match (not shown). Source RF generator 1003 may have a frequency between 100 and 180 MHz, for example, and in a particular embodiment, is in the 162 MHz band. The gas from the gas source 1006 enters into a manifold 1020 within the showerhead plate 1016 and exits into processing region 1002 of the chamber 1042 through openings into the showerhead plate 1016. In an embodiment, the heat transfer plate 1018 comprises channels 1019 through which heat transfer fluid is flown. The showerhead plate 1016 and the heat transfer plate 1018 are fabricated from an RF conductive material, such as aluminum or stainless steel. In certain embodiments, a gas nozzle or other suitable gas distribution assembly is provided for distribution of process gases into the chamber 1042 instead of (or in addition to) the showerhead plate 1016.

The processing region 1002 may comprise a lower electrode 1061 onto which a substrate 1005 is secured. Portions of a process ring 1097 that surrounds the substrate 1005 may also be supported by the lower electrode 1061. The substrate 1005 may be inserted into (or extracted from) the chamber 1042 through a slit valve tunnel 1041 through the chamber 1042. A door for the slit valve tunnel 1041 is omitted for simplicity. The lower electrode 1061 may be an electrostatic chuck. The lower electrode 1061 may be supported by a support member 1057. In an embodiment, lower electrode 1061 may include a plurality of heating zones, each zone independently controllable to a temperature set point. For example, lower electrode 1061 may comprise a first thermal zone proximate a center of substrate 1005 and a second thermal zone proximate to a periphery of substrate 1005. Bias power RF generator 1025 is coupled to the lower electrode 1061 through a match 1027. Bias power RF generator 1025 provides bias power, if desired, to energize the plasma. Bias power RF generator 1025 may have a low frequency between about 2 MHz to 60 MHz for example, and in a particular embodiment, is in the 13.56 MHz band.

In an embodiment, the one or more sensor assemblies may be located at various locations throughout the processing apparatus 1000. For example, a sensor assembly may be located in one or more locations, such as, but not limited to, along a sidewall of the chamber 1042, in the evacuation region 1004, adjacent to the process ring 1097, and integrated with the lid assembly 1010. Accordingly, detection of various chamber conditions in multiple locations through the processing apparatus 1000 may be determined. The chamber conditions supplied by the one or more sensor assemblies may be used to modify one or more parameters, such as, for example, processing recipe parameters, cleaning schedules for the processing apparatus 1000, component replacement determinations, and the like.

Figure 11:
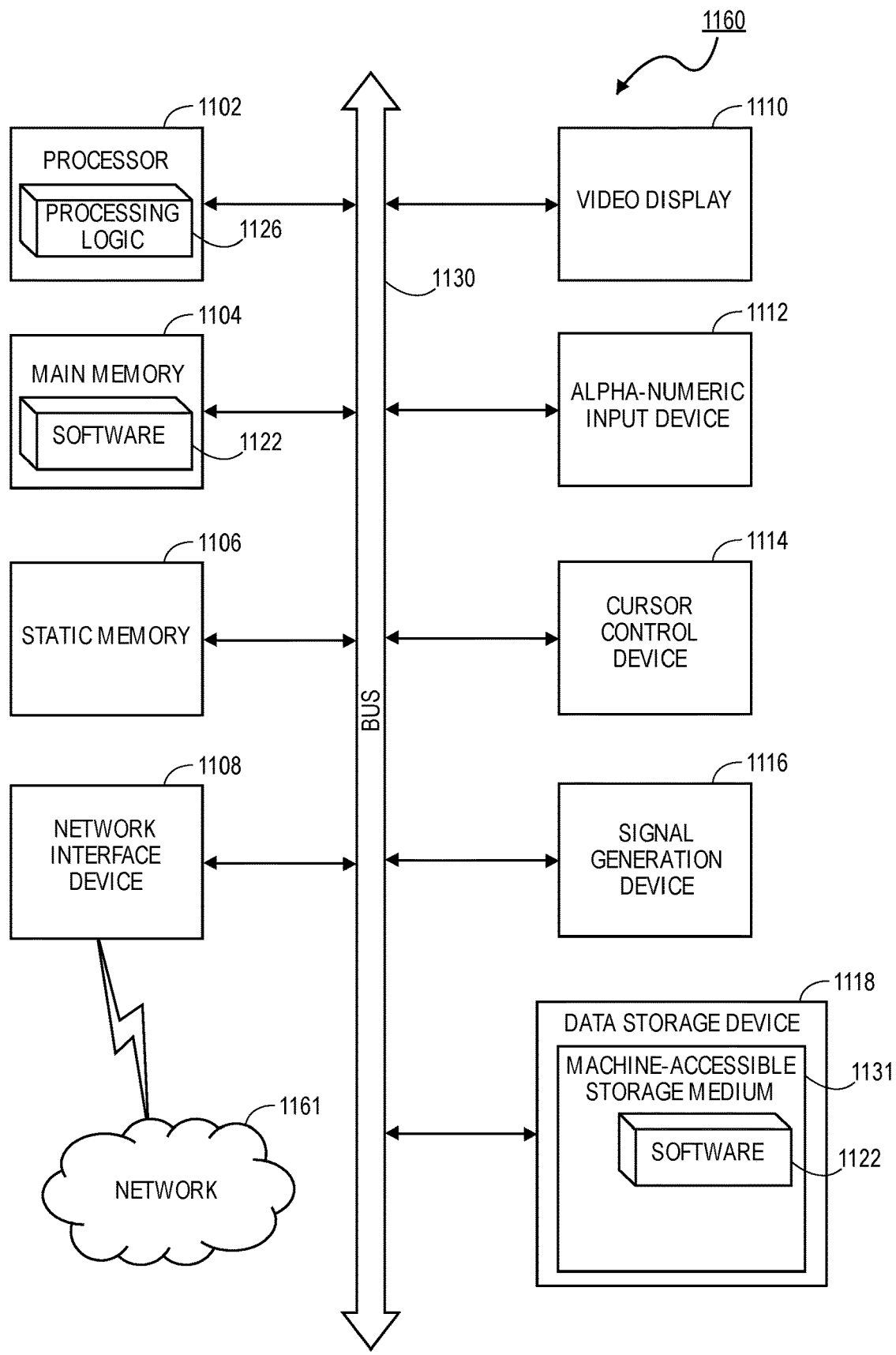
FIG. 11 illustrates a block diagram of an exemplary computer system that may be used in conjunction with a sensor assembly, in accordance with an embodiment.

Referring now to FIG. 11, a block diagram of an exemplary computer system 1160 of a processing tool is illustrated in accordance with an embodiment. In an embodiment, computer system 1160 is coupled to and controls processing in the processing tool. The computer system 1160 may be communicatively coupled to one or more sensor assemblies, such as those disclosed herein. The computer system 1160 may utilize outputs from the one or more sensor assemblies in order to modify one or more parameters, such as, for example, processing recipe parameters, cleaning schedules for the processing tool, component replacement determinations, and the like.

Computer system 1160 may be connected (e.g., networked) to other machines in a Local Area Network (LAN), an intranet, an extranet, or the Internet. Computer system 1160 may operate in the capacity of a server or a client machine in a client-server network environment, or as a peer machine in a peer-to-peer (or distributed) network environment. Computer system 1160 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 1160, the term "machine" shall also be taken to include any collection of machines (e.g., computers) that individually or jointly execute a set (or multiple sets) of instructions to perform any one or more of the methodologies described herein.

Computer system 1160 may include a computer program product, or software 1122, having a non-transitory machine-readable medium having stored thereon instructions, which may be used to program computer system 1160 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 1160 includes a system processor 1102, a main memory 1104 (e.g., read-only memory (ROM), flash memory, dynamic random access memory (DRAM) such as synchronous DRAM (SDRAM) or Rambus DRAM (RDRAM), etc.), a static memory 1106 (e.g., flash memory, static random access memory (SRAM), etc.), and a secondary memory 1118 (e.g., a data storage device), which communicate with each other via a bus 1130.

System processor 1102 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 1102 may also be one or more special-purpose processing devices such as an application specific integrated circuit (ASIC), a field programmable gate array (FPGA), a digital signal system processor (DSP), network system processor, or the like. System processor 1102 is configured to execute the processing logic 1126 for performing the operations described herein.

The computer system 1160 may further include a system network interface device 1108 for communicating with other devices or machines. The computer system 1160 may also include a video display unit 1110 (e.g., a liquid crystal display (LCD), a light emitting diode display (LED), or a cathode ray tube (CRT)), an alphanumeric input device 1112 (e.g., a keyboard), a cursor control device 1114 (e.g., a mouse), and a signal generation device 1116 (e.g., a speaker).

The secondary memory 1118 may include a machine-accessible storage medium 1131 (or more specifically a computer-readable storage medium) on which is stored one or more sets of instructions (e.g., software 1122) embodying any one or more of the methodologies or functions described herein. The software 1122 may also reside, completely or at least partially, within the main memory 1104 and/or within the system processor 1102 during execution thereof by the computer system 1160, the main memory 1104 and the system processor 1102 also constituting machine-readable storage media. The software 1122 may further be transmitted or received over a network 1161 via the system network interface device 1108. In an embodiment, the network interface device 1108 may operate using RF coupling, optical coupling, acoustic coupling, or inductive coupling.

While the machine-accessible storage medium 1131 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

Example 1: a sensor assembly, comprising: a sensor module, wherein the sensor module comprises: a substrate; a capacitor with a first electrode and a second electrode on the substrate; and a capacitive-to-digital converter (CDC) electrically coupled to the first electrode and the second electrode; and a housing assembly attached to the sensor module, wherein the housing assembly comprises: a shaft, wherein the shaft is hollow; and a cap over a first end of the shaft, wherein the cap has an opening to expose the capacitor.

Example 2: the sensor assembly of Example 1, wherein the substrate is over the first end of the shaft.

Example 3: the sensor assembly of Example 2, wherein the cap secures the substrate against the first end of the shaft.

Example 4: the sensor assembly of Example 3, wherein the first end of the shaft comprises a groove and a seal ring is in the groove, wherein the seal ring is compressed between the substrate and the shaft.

Example 5: the sensor assembly of Examples 1-3, further comprising: a plate covering a second end of the shaft, wherein the plate forms a hermetic seal with the shaft, wherein the substrate and the plate define an interior volume of the shaft.

Example 6: the sensor assembly of Example 5, wherein the CDC is within the interior volume of the shaft.

Example 7: the sensor assembly of Example 5, wherein the housing assembly further comprises: a housing body, wherein the shaft is inserted into the housing body.

Example 8: the sensor assembly of Example 7, wherein the CDC is within the housing body.

Example 9: the sensor assembly of Example 8, wherein the CDC is attached to the substrate by interconnects that extend through the interior volume of the shaft and pass through the plate.

Example 10: the sensor assembly of Example 9, wherein the interconnects are welded to pads on the substrate, or wherein the interconnects are secured against pads on the substrate by springs.

Example 11: the sensor assembly of Examples 7-10, wherein the shaft is screwed into the housing body.

Example 12: the sensor assembly of Examples 7-11, further comprising: a vacuum electrical feedthrough attached to the housing body.

Example 13: a sensor assembly, comprising: a shaft with a first end and a second end, wherein the shaft is hollow; a capacitor on a first surface of a substrate, wherein a second surface of the substrate interfaces with the first end of the shaft; and a cap over the first end of the shaft, wherein the cap secures the substrate against the first end of the shaft, and wherein an opening through the cap exposes the capacitor.

Example 14: the sensor assembly of Example 13, further comprising: a plate covering an opening at the second end of the shaft.

Example 15: the sensor assembly of Example 13 or Example 14, wherein the cap is welded to the shaft.

Example 16: the sensor assembly of Examples 13-15, wherein an exterior surface of the shaft proximate to the second end is threaded.

Example 17: the sensor assembly of Examples 13-16, further comprising: a groove in the first end of the shaft; and a seal ring in the groove, wherein the seal ring is compressed between the substrate and the shaft to provide a hermetic seal.

Example 18: the sensor assembly of Examples 13-17, further comprising: a capacitance-to-digital converter (CDC) electrically coupled to the capacitor.

Example 19: the sensor assembly of Example 18, wherein interconnects to the CDC are attached to pads on the substrate with a solder.

Example 20: the sensor assembly of Example 18, wherein interconnects to the CDC are attached to pads on the substrate with a spring or wherein the interconnects to the CDC are welded to the pads on the substrate.

Example 21: a processing tool, comprising: a chamber defining an interior volume, wherein the interior volume comprises a processing region and an evacuation region; a lid to seal the chamber; a substrate support within the processing region, the substrate support for supporting a substrate and a process ring; and a sensor assembly attached to the processing tool, wherein the sensor assembly comprises: a sensor module, wherein the sensor module comprises: a substrate; a capacitor with a first electrode and a second electrode on the substrate; and a capacitive-to-digital converter (CDC) electrically coupled to the first electrode and the second electrode; and a housing assembly attached to the sensor module, wherein the housing assembly comprises: a shaft, wherein the shaft is hollow; a cap over a first end of the shaft, wherein the cap has an opening to expose the capacitor; a plate covering a second end of the shaft, wherein the plate forms a hermetic seal with the shaft, wherein the substrate and the plate define an interior volume of the shaft; a housing body, wherein the shaft attached to the housing body; and a vacuum electrical feedthrough attached to the housing body.

Example 22: the processing tool of Example 21, wherein the shaft passes through a wall of the chamber, and wherein the capacitor is exposed to the processing region.

Example 23: the processing tool of Example 21, wherein the sensor assembly is integrated with the lid, and wherein the capacitor is exposed to the processing region.

Example 24: the processing tool of Example 21, wherein the vacuum electrical feedthrough is secured against a port in a chamber wall, and wherein the shaft extends up from the vacuum electrical feedthrough in order to position the capacitor adjacent to the process ring.

Example 25: the processing tool of Example 21, wherein the shaft at least partially passes through a port in a chamber wall, and is exposed to the evacuation region.

Example 26: a sensor assembly, comprising: a vacuum electrical feedthrough, wherein the vacuum electrical feedthrough comprises a first flange where the first flange has a first hole; a housing body attached to the vacuum electrical feedthrough, wherein the housing body has an internal volume, a first end, and a second end, and wherein the housing body comprises a second flange on the first end of the housing body, where the second flange has a second hole that is aligned with the first hole on the vacuum electrical feedthrough; a shaft having a first end and a second end, wherein the first end of the shaft is attached to the second end of the housing body, wherein the shaft is hollow; and a capacitive sensor secured against the second end of the shaft by a cap, wherein the cap comprises an opening to expose a first electrode and a second electrode of the capacitive sensor.

Example 27: the sensor assembly of Example 26, wherein the housing body further comprises a third flange on the second end of the housing body, where the third flange has one or more third holes, wherein the third holes are offset from the second holes.

Example 28: the sensor assembly of Example 27, wherein the third holes are positioned to interface with holes on a mounting plate attached to an exterior surface of a chamber wall of a plasma processing tool, and wherein the shaft passes through the chamber wall.

Example 29: the sensor assembly of Example 27 or Example 28, further comprising: an adapter surrounding the shaft, wherein the adaptor is configured to interface with a port in a chamber wall of a plasma processing tool, wherein the shaft passes through a thickness of the adapter, and wherein the third holes are positioned to interface with holes on the adapter.

Example 30: the sensor assembly of Examples 26-29, wherein an interior of the shaft is separated from the internal volume of the housing body by a plate.

Example 31: the sensor assembly of Examples 26-30, wherein the shaft screws into the housing body.

Example 32: the sensor assembly of Examples 26-31, wherein the cap is welded to the shaft.

Example 33: the sensor assembly of Examples 26-32, wherein the first holes are configured to interface with holes into an interior surface of a chamber of a plasma processing chamber, and wherein the vacuum electrical feedthrough is inserted into a port through a wall of the chamber.

Example 34: the sensor assembly of Example 33, wherein the shaft has a length sufficient to position a top surface of the capacitive sensor substantially parallel to a plasma screen that surrounds a process ring of the plasma processing chamber.

Example 35: the sensor assembly of Examples 26-34, wherein the cap surrounds the shaft and the housing body.

Example 36: the sensor assembly of Example 35, wherein the cap is secured against an interior surface of a lid assembly of a plasma processing tool.

Example 37: the sensor assembly of Examples 26-35, further comprising a capacitance-to-digital converter (CDC) electrically coupled to the capacitive sensor.

Example 38: the sensor assembly of Example 37, wherein the CDC is within the shaft.

Example 39: sensor assembly of Example 37, wherein the CDC is within the housing body.

Example 40: the sensor assembly of Examples 26-39, wherein the second end of the shaft comprises a groove and a seal ring is in the groove, wherein the seal ring is compressed between the substrate and the shaft.

What is claimed is:

1. A sensor assembly, comprising:
    a shaft with a first end and a second end, wherein the shaft is hollow;
    a capacitor on a first surface of a substrate, wherein a second surface of the substrate is in contact with the first end of the shaft; and
    a cap over the first end of the shaft, wherein the cap secures the substrate against the first end of the shaft, wherein the cap is in contact with the substrate, and wherein an opening through the cap exposes the capacitor.

2. The sensor assembly of claim 1, further comprising: a plate covering an opening at the second end of the shaft.

3. The sensor assembly of claim 1, wherein the cap is welded to the shaft.

4. The sensor assembly of claim 1, wherein an exterior surface of the shaft proximate to the second end is threaded.

5. The sensor assembly of claim 1, further comprising:
    a groove in the first end of the shaft; and
    a seal ring in the groove, wherein the seal ring is compressed between the substrate and the shaft to provide a hermetic seal.

6. The sensor assembly of claim 1, wherein the substrate extends vertically over the first end of the shaft.

7. A sensor assembly, comprising:
    a vacuum electrical feedthrough, wherein the vacuum electrical feedthrough comprises a first flange where the first flange has a first hole;
    a housing body attached to the vacuum electrical feedthrough, wherein the housing body has an internal volume, a first end, and a second end, and wherein the housing body comprises a second flange on the first end of the housing body, where the second flange has a second hole that is aligned with the first hole on the vacuum electrical feedthrough;
    a shaft having a first end and a second end, wherein the first end of the shaft is attached to the second end of the housing body, wherein the shaft is hollow; and
    a capacitive sensor secured against the second end of the shaft by a cap, wherein the cap comprises an opening to expose a first electrode and a second electrode of the capacitive sensor.

8. The sensor assembly of claim 7, wherein the housing body further comprises a third flange on the second end of the housing body, where the third flange has one or more third holes, wherein the third holes are offset from the second holes.

9. The sensor assembly of claim 7, wherein an interior of the shaft is separated from the internal volume of the housing body by a plate.

10. The sensor assembly of claim 7, wherein the shaft screws into the housing body.

11. The sensor assembly of claim 7, wherein the cap is welded to the shaft.

12. The sensor assembly of claim 7, wherein the cap surrounds the shaft and the housing body.

13. The sensor assembly of claim 7, wherein the second end of the shaft comprises a groove and a seal ring is in the groove, wherein the seal ring is compressed between the substrate and the shaft.

14. The sensor assembly of claim 7, wherein the capacitive sensor extends vertically over the first end of the shaft.

* * * * *